US008344724B2

(12) United States Patent
Leeb et al.

(10) Patent No.: US 8,344,724 B2
(45) Date of Patent: Jan. 1, 2013

(54) NON-INTRUSIVE MONITORING OF POWER AND OTHER PARAMETERS

(75) Inventors: Steven B. Leeb, Belmont, MA (US); Zachary A. Clifford, Norwich, CT (US); John J. Cooley, Cambridge, MA (US); Al-Thaddeus Avestruz, Waltham, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 587 days.

(21) Appl. No.: 12/614,245

(22) Filed: Nov. 6, 2009

(65) Prior Publication Data

US 2011/0109306 A1   May 12, 2011

(51) Int. Cl.
*G01N 27/72*   (2006.01)
*G01R 31/08*   (2006.01)
*G01R 19/00*   (2006.01)

(52) U.S. Cl. .................. 324/228; 324/76.11; 324/522
(58) Field of Classification Search ................ 324/228, 324/76.11, 522
See application file for complete search history.

(56) References Cited

U.S. PATENT DOCUMENTS

| 4,698,621 | A | 10/1987 | Masot |
| 4,706,073 | A | 11/1987 | Vila Masot |
| 5,315,531 | A | 5/1994 | Oravetz et al. |
| 5,606,482 | A | 2/1997 | Witmer |
| 6,076,016 | A | 6/2000 | Feierbach |
| 6,292,717 | B1 | 9/2001 | Alexander et al. |
| 7,174,261 | B2 | 2/2007 | Gunn et al. |
| 7,575,535 | B2 | 8/2009 | Yamamoto |
| 2002/0032535 | A1 | 3/2002 | Alexander et al. |
| 2009/0242367 | A1 | 10/2009 | Bruel et al. |

FOREIGN PATENT DOCUMENTS

| CN | 101 312 764 A | 11/2008 |
| DE | 102 48 640 A1 | 4/2004 |
| EP | 0 755 108 A1 | 1/1997 |
| EP | 0 823 764 A2 | 2/1998 |
| EP | 1 435 635 A1 | 7/2004 |
| GB | 2 271 895 A | 4/1994 |
| JP | 07115186 A | 5/1995 |
| JP | 2005278367 A | 10/2005 |
| WO | WO 89/09456 A1 | 10/1989 |
| WO | WO 95/29527 A1 | 11/1995 |

(Continued)

OTHER PUBLICATIONS

L. Devlin, "Mixers," Oct. 18, 2006, pp. 1-20, Retrieved from the Internet on Feb. 14, 2011: URL: http://web.archive.org/web/20061018143846/http://www.plextek.com/papers/mixers2.pdf.

(Continued)

*Primary Examiner* — Reena Aurora
(74) *Attorney, Agent, or Firm* — Wolf, Greenfield & Sacks, P.C.

(57) ABSTRACT

Methods and apparatus for non-intrusive power monitoring and current measurement in a circuit breaker without modification of the breaker panel or the circuit breaker itself. In one example, an inductive pickup sensor senses current from the breaker face, an inductive link transmits power through a steel breaker panel door, and a passive balanced JFET modulator circuit modulates a carrier signal on the inductive link with information regarding the sensed current. A demodulated breaker current signal is available outside of the breaker panel door. The JFET modulator circuit does not require DC power to modulate the carrier signal with the information regarding the sensed current from the breaker. Such methods and apparatus may be interfaced with a spectral envelope load detection system that can monitor multiple loads from a central location.

15 Claims, 16 Drawing Sheets

FOREIGN PATENT DOCUMENTS

| WO | WO 96/07192 A2 | 3/1996 |
|----|----------------|--------|
| WO | WO 96/37025 A1 | 11/1996 |
| WO | WO 97/08914 A1 | 3/1997 |
| WO | WO 98/38666 A1 | 9/1998 |
| WO | WO 2004/095667 A1 | 11/2004 |

OTHER PUBLICATIONS

International Search Report for International Application No. PCT/US2010/055578 mailed Feb. 24, 2011.

N. Bowler, "Frequency-dependence of relative permeability in steel," *Review of Quantitative Nondestructive Evaluation*, 2006, pp. 1269-1276, vol. 25.

Z. Clifford, J. J. Cooley, A-T Avestruz, Z. Remscrim, D. Vickery, and S. B. Leeb, "A retrofit 60 hz current sensor for non-intrusive power monitoring at the circuit breaker," *25th Annual IEEE Applied Power Electronics Conf. & Expo. (APEC)*, Feb. 21-25, 2010, pp. 444-451.

R. W. Cox, M. Piber, G. R. Mitchell, P. L. Bennett, J. Paris, W. Wichakool, and S. B. Leeb, "Improving shipboard maintenance practices using non-intrusive load monitoring," ASNE Intelligent Ships Symposium VII, Philadelphia, PA, May 2007.

R. Cox, S. B. Leeb, S. R. Shaw, and L. K. Norford, "Transient event detection for nonintrusive load monitoring and demand side management using voltage distortion," *Applied Power Electronics Conf. & Expo. (APEC)*, Mar. 2006, pp. 19-23.

R. W. Cox, P. Bennett, D. McKay, J. Paris, and S. B. Leeb, "Using the nonintrusive load monitor for shipboard supervisory control," *In IEEE Electric Ship Technologies Symposium*, Arlington, VA, May 2007.

T. DeNucci, R. Cox, S. B. Leeb, J. Paris, T. J. McCoy, C. Laughman, and W. Greene., "Diagnostic indicators for shipboard systems using non-intrusive load monitoring," *In IEEE Electric Ship Technologies Symposium*, Jul. 2005, Philadelphia, Pennsylvania.

Inc. Ferroxcube. Tx25/15/1O-3e6 datasheet. Available http://www.ferroxcube.com!prod!assets!tx251510.pdf.

W. Greene, J. S. Ramsey, S. B. Leeb, T. DeNucci, J. Paris, M. Obar, R. Cox, C. Laughman, and T. J. McCoy, "Non-intrusive monitoring for condition-based maintenance," *In American Society of Naval Engineers Reconfigurability and Survivability Symposium*, Feb. 2005. 11 pages, Atlantic Beach, Florida.

S. B. Leeb, J. L. Kirtley, Jr., W. Wichakool, Z. Remscrim, C. Tidd, J. A. Goshorn, K. Thomas, R. W. Cox, and R. Chaney, "How much DC power is necessary?," *Naval Engineers Journal*, Jun. 2010, pp. 79-92, vol. 122 (2).

U. A. Khan, S. B. Leeb, and M. C. Lee, "A multiprocessor for transient event detection." *IEEE Transactions on Power Delivery*, 1997, pp. 51-60, vol. 12, No. 1.

S. B. Leeb, S. R. Shaw, and Jr. J. L. Kirtley, "Transient event detection in spectral envelope estimates for non-intrusive load monitoring," *IEEE Transactions on Power Delivery*, Jul. 1995, pp. 1200-1210, vol. 10, No. 3.

G. Mitchell, R. W. Cox, M. Piber, P. Bennett, J. Paris, W. Wichakool, and S. B. Leeb, "Shipboard fluid system diagnostic indicators using non-intrusive load monitoring," *In American Society for Naval Engineers Day 2007*, Jun. 2007, 11 pages, Arlington, VA.

G. R. Mitchell, R. W. Cox, J. Paris, and S. B. Leeb, "Shipboard fluid system diagnostic indicators using non-intrusive load," *Naval Engineers Journal*, Nov. 2007, 11 pages, vol. 119, No. 1.

J. P. Mosman, R. W. Cox, D. McKay, S. B. Leeb, and T. McCoy, "Diagnostic indicators for shipboard cycling systems using non-intrusive load monitoring," *In American Society for Naval Engineers Day 2006*, Jun. 2006, Arlington, VA.

L. K. Norford and S. B. Leeb, "Non-intrusive electrical load monitoring in commercial buildings based on steady state and transient load-detection algorithms," *Energy and Buildings*, 1996, pp. 51-64, vol. 24.

U. Orji, C. Schantz, D. E. Barber, S. B. Leeb, R. Cox, J. A. Goshorn, and K. Thomas, "Electrical-based condition monitoring using shaft speed oscillation harmonics," ASNE Day 2011, Crystal City, Arlington, VA, Feb. 2011.

J. Paris, Z. Remscrim, K. Douglas, S. B. Leeb, R. W. Cox, S. T. Galvin, S. G. Coe, J. R. Haag, and A. Goshorn, "Scalability of non-intrusive load monitoring for shipboard applications," *2009 MIT Sea Grant*, 11 pages.

E. Proper, R. W. Cox, P. Branch, R. Jones, A. Fuller, S. B. Leeb, and E. L. Foulks, "A real-time non-intrusive load monitor for shipboard applications," ASNE Day 2008, Nyatt Regency Crystal City, Arlington, VA, Jun. 2008.

E. Proper, R. W. Cox, S. B. Leeb, K. Douglas, J. Paris, W. Wichakool, L. Foulks, R. Jones, P. Branch, A. Fuller, J. Leghorn, and G. Elkins, "Field demonstration of a real-time non-intrusive monitoring system for condition-based maintenance," *In Electric Ship Design Symposium*, Feb. 2009, 12 pages., National Harbor, Maryland.

J. S. Ramsey, S. B. Leeb, T. DeNucci, J. Paris, M. Obar, R. Cox, C. Laughman, and T. J. McCoy, "Shipboard applications of non-intrusive load monitoring," *In American Society of Naval Engineers Reconfigurability and Survivability Symposium*, Feb. 2005, Atlantic Beach, Florida.

Z. Remscrim, J. Paris, S. B. Leeb, S. R. Shaw, S. Neuman, C. Schantz, S. Muller, and S. Page, "FPGA-based spectral envelope preprocessor for power monitoring and control," *25th Annual IEEE Applied Power Electronics Conf & Expo. (APEC)*, Feb. 21-25, 2010, pp. 2194-2201.

S. R. Shaw, S. B. Leeb, L. K. Norford, and R. W. Cox. "Nonintrusive load monitoring and diagnostics in power systems," *IEEE Transactions on Instrumentation and Measurement*, Jul. 2008, pp. 1445-1454, vol. 57, No. 7.

NON-INTRUSIVE MONITORING OF POWER AND OTHER PARAMETERS

BACKGROUND

Utilities provide electrical power to consumers in response to demand. The total amount of electricity provided to consumers at any given time changes based on various factors, such as environmental conditions and time of day. For example, consumers may require large amounts of electricity to run air conditioning systems on a hot summer afternoon. Utilities may have difficulty supplying enough electricity to meet the demand during peak hours. As a result, consumers may be charged a higher rate for electricity use during peak hours than during off-peak hours.

Consumers typically have little information about the amount of power they consume. The consumer's electric utility may provide the consumer with a monthly bill that indicates the total amount of power consumed during the month, as measured by the utility meter. Unfortunately, the consumer does not have access to more detailed information about their power usage, such as the amount of power consumed by various devices within the home. Although power meters are available for measuring the power consumed by a single device at a given time, the user may need to manually plug the power meter into the device's electrical connection to make the measurement. Manually connecting the power meter to individual devices may take a significant amount of time and can lead to a complicated and costly set of measurement devices.

Various advantages are possible if more information is made available about consumers' power usage. As an example, consumers may learn which of their devices consume the most power, enabling the consumer to turn off these devices at appropriate times to reduce costs and/or conserve energy. A smart electrical grid or "Smart Grid" has been proposed that may take advantage of power-related information to provide a more flexible power infrastructure with various advantages. A barrier to implementing such a system is the present difficulty of measuring the power usage of individual devices or groups of devices.

Non-Intrusive Load Monitoring (NILM) is an approach to electrical system diagnostics and power monitoring that can employ a smaller number of sensors than other device-specific monitoring systems. A NILM system can identify and monitor individual loads on a power distribution system by measuring the frequency content of transient events in the current signals. Such monitoring may be performed from a centralized remote location. According to conventional techniques, the current signal is measured using a magnetic field sensor wrapped around the utility feed of the subsystem to be monitored. However, such a sensor may be impractical for some applications. A wrap-around sensor cannot be used when placed around both the Line and Neutral wires in the home because the sensor would measure a current of zero due to the flow of identical current in opposite directions. Using a wrap-around sensor to monitor power in the home may be expensive because skilled labor would be needed to separate the Line and Neutral wires so that the wrap-around magnetic field sensor can be placed around only one of the wires.

SUMMARY

Various inventive methods and apparatus described herein can be used at a circuit breaker to monitor the power provided to the associated circuitry in a non-intrusive manner. In particular, non-intrusive power monitoring techniques facilitated by methods and apparatus disclosed herein may be employed to determine information about power usage and behavior of the loads connected to the circuit breaker, without modification of the circuit breaker or its associated wiring.

In some embodiments, a magnetic sensor may be placed on the face of the circuit breaker, where it senses the magnetic field produced by a current-carrying conductor within the circuit breaker. A carrier signal may be transmitted to the inside of a circuit breaker unit (housing multiple circuit breakers) using an inductive link through the breaker unit door. A mixer circuit inside of the circuit breaker unit may modulate the received carrier signal with the sensed power signal. The modulated signal may be transmitted to the outside of the circuit breaker unit via the inductive link. The sensed power signal can then be demodulated and processed.

Some embodiments relate to a method of sensing an electrical parameter of a circuit breaker. The method includes sensing a field produced by the circuit breaker using a sensor positioned outside of the circuit breaker in a proximity of the circuit breaker.

Some embodiments relate to a monitoring system. The monitoring system includes a sensor that senses a physical parameter and produces a sensed signal in response to the physical parameter. The monitoring system also includes a mixer circuit that modulates a second signal in response to the sensed signal to produce a modulated signal. A magnetic link transmits the modulated signal.

In some aspects, the sensor and the mixer circuit are positioned inside of a sealed enclosure and the magnetic link sends a sensed signal through the wall of the sealed enclosure. In some aspects, the sealed enclosure is hermetically sealed.

Some embodiments relate to a mixer circuit that includes at least one transistor that receives an AC carrier signal and a signal representing a sensed physical parameter, wherein the at least one transistor modulates the AC carrier signal in response to the signal representing the sensed physical parameter.

Some embodiments relate to a mixer circuit that includes a first transistor having a first gate; a first resistor in series with the first transistor; a second resistor in series with the first resistor; and a second transistor in series with the second resistor, the second transistor having a second gate coupled to the first gate.

Some embodiments relate to a transformer that includes a first coil positioned on an interior of a circuit breaker unit; and a second coil positioned on an exterior of the circuit breaker unit.

Some embodiments relate to a circuit for detecting a magnetic field in a proximity of a circuit breaker. The circuit includes a first circuit that generates a drive signal to supply power to a region in a proximity of a circuit breaker, wherein the first circuit measures a current of the drive signal to detect the magnetic field in the proximity of the circuit breaker.

Some embodiments relate to a method of transmitting a signal out of a region. The method includes modulating a first signal using a second signal detected in the region to produce a modulated signal, and transmitting the modulated signal out of the region.

Some embodiments relate to a system for monitoring an electrical parameter of a circuit breaker. The system includes a first circuit that produces a carrier signal; a first magnetic coupler driven by the carrier signal; a second magnetic coupler that is magnetically coupled to the first magnetic coupler to receive the carrier signal; a sensor that detects a field in a proximity of circuit breaker and produces a sensed signal in response to the field; and a mixer circuit that modulates the carrier signal in response to the sensed signal.

Some embodiments relate to a magnetic sensor. The magnetic sensor includes a core of ferromagnetic material and a coil wrapped around the core. The core may have a curved shaped that follows the shape of the magnetic field in the proximity of a circuit breaker.

Some embodiments relate to a system for monitoring a signal at a circuit breaker of a circuit breaker unit. The circuit breaker unit has a circuit breaker panel and a door. The circuit breaker is positioned at the circuit breaker panel and includes a conductor carrying a current that produces a magnetic field in a proximity of the circuit breaker. The system includes a first circuit to produce a carrier signal. The first circuit is positioned outside of the circuit breaker unit. The system also includes a first magnetic coupler driven by the carrier signal. The first magnetic coupler is positioned outside of the circuit breaker unit on a first side of the door. The system also includes a second magnetic coupler positioned inside of the circuit breaker unit on a second side of the door between the door and the circuit breaker panel. The second magnetic coupler is inductively coupled to the first magnetic coupler. The second magnetic coupler is configured to produce a regenerated carrier signal inside of the circuit breaker unit. The system also includes a magnetic field sensor positioned in the proximity of the circuit breaker between the door and the circuit breaker panel. The magnetic field sensor is configured to produce a sensed signal in response to the magnetic field. The system further includes a mixer circuit positioned inside of the circuit breaker unit. The mixer circuit is coupled to the second magnetic coupler to modulate the regenerated carrier signal in response to the sensed signal.

This summary is presented by way of illustration and is not intended to be limiting.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein.

BRIEF DESCRIPTION OF THE DRAWINGS

The drawings are not necessarily to scale, emphasis instead generally being placed upon illustrating the principles of the invention.

DETAILED DESCRIPTION

Following below are more detailed descriptions of various concepts related to, and embodiments of, inventive systems, methods and apparatus for non-intrusive monitoring of power and other parameters. It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes.

In accordance with the techniques described herein according to various inventive embodiments, power may be monitored at a circuit breaker without modification of the circuit breaker unit. These techniques may enable simple installation of power monitoring equipment at a standard circuit breaker used in a home or office. In some embodiments, a magnetic sensor can be positioned in the proximity of a circuit breaker to sense the magnetic field produced by a conductor within the circuit breaker. For example, the magnetic sensor can be placed at the face of the circuit breaker between the circuit breaker panel and the door of the circuit breaker unit. The sensed signal may be mixed with a received carrier signal and transmitted out of the circuit breaker unit via a magnetic link through the breaker unit door. The techniques described herein can provide an easy-to-install, low-cost power monitoring solution at the circuit breaker.

Figure 1A:
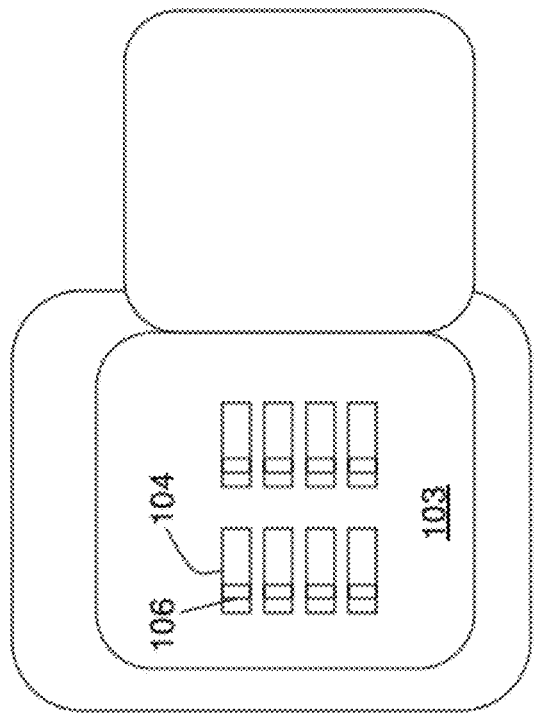
FIGS. 1A-1C show a typical circuit breaker and circuit breaker unit.
Figure 1B:
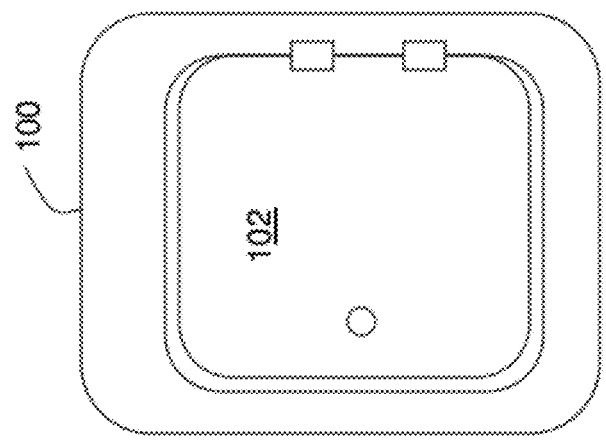

FIG. 1A shows a typical circuit breaker unit 100 of the type commonly used in homes and offices. Circuit breaker unit 100 has a door 102 that may be opened and closed by hand. The door 102 may be closed most of the time for safety reasons, as shown in FIG. 1A. FIG. 1B shows the interior of the circuit breaker unit 100 when the door 102 is open. The circuit breaker unit 100 may include a circuit breaker panel 103 having a plurality of circuit breakers 104 disposed therein, each circuit breaker being connected to a different circuit to provide overcurrent protection. Circuit breaker 104 has a toggle switch 106 that may be in the "on" position or the "off" position. When current is flowing through the circuit in normal operation the toggle switch 106 is in the "on" position to allow the current to flow to the circuit protected by the circuit breaker 104. When circuit breaker 104 senses an overcurrent condition, the circuit breaker 104 switches off as a protective mechanism to prevent current from flowing to the circuit. When the circuit breaker 104 switches off, the toggle switch 106 may flip to the "off" position. The circuit breaker 104 can be re-set manually by flipping the toggle switch 106 back to the "on" position.

In some designs, the circuit breaker unit 100 and/or door 102 may be constructed of a metal, such as steel. The housing of the circuit breaker 104 and the toggle switch 106 may be formed of a hard plastic material. It should be appreciated, however, that these components may be formed of a variety of other materials, and are not limited to steel and plastic, respectively.

Figure 1C:
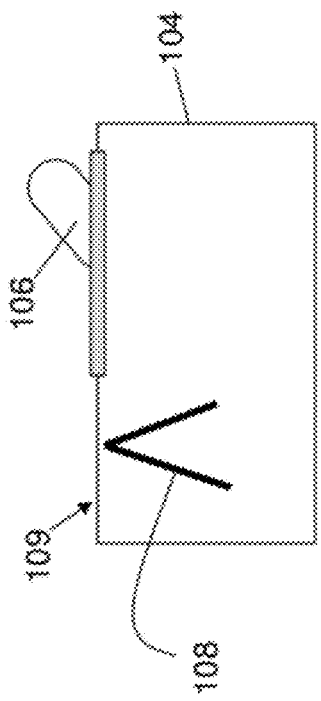

FIG. 1C shows a cross-sectional view of a circuit breaker 104, including toggle switch 106 and a conductor 108. Conductor 108 carries the current for the circuit that is protected by the circuit breaker 104. For purposes of illustration, only a portion of conductor 108 is shown in FIG. 1C.

The inventors have recognized and appreciated that a circuit breaker often is constructed in a manner such that conductor 108 is positioned adjacent to the face 109 of the circuit breaker 104, as illustrated in FIG. 1C. Conductor 108 may be positioned in a region that is beyond the range of travel of toggle switch 106. The current flowing through conductor 108 creates a magnetic field in the proximity of conductor 108. In accordance with some embodiments, the magnetic field produced by conductor 108 can be sensed outside of the housing of circuit breaker 104. In accordance with some embodiments, sensing of the magnetic field produced by conductor 108 can be used for non-intrusive power monitoring of the circuit protected by circuit breaker 104.

Figure 2:
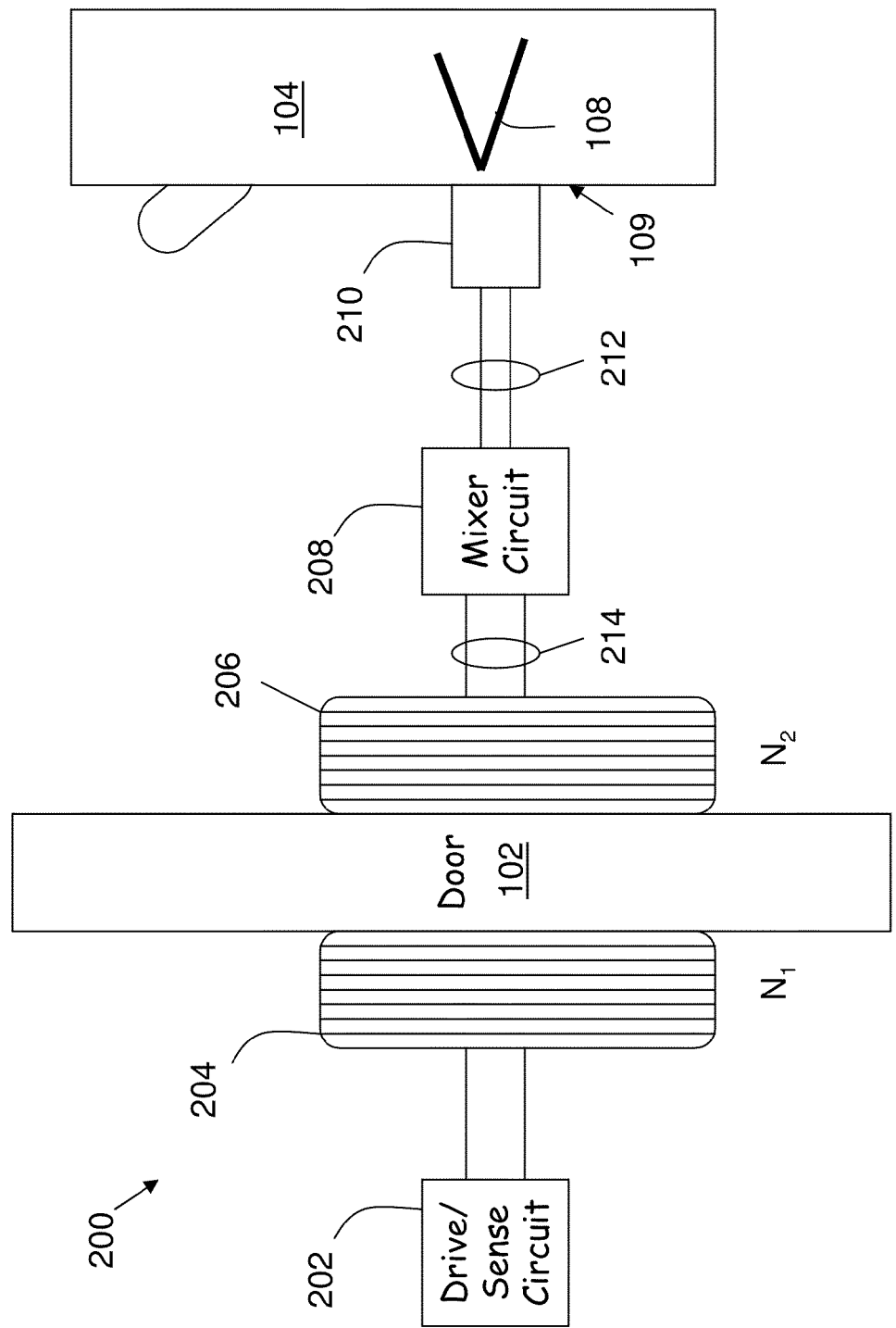
FIG. 2 shows a system for non-intrusive power monitoring at the circuit breaker, according to some embodiments.

FIG. 2 shows a system for non-intrusive power monitoring at the circuit breaker, according to some embodiments. System 200 includes a drive/sense circuit 202 and an outer magnetic coupler 204 that can be positioned on the outside of circuit breaker unit 100. Outer magnetic coupler 204 may include a coil of wire positioned on the outside of the breaker unit door 102. System 200 also includes an inner magnetic coupler 206, a mixer circuit 208, and a magnetic sensor 210 that can be positioned on the inside of circuit breaker unit 100, in the region between the door 102 and the circuit breaker panel 103. Inner magnetic coupler 206 may include a coil of wire positioned on the inside of the breaker unit door 102 in a manner that is aligned with outer magnetic coupler 206. Magnetic couplers 204 and 206 can provide a magnetic link for receiving a carrier signal from drive/sense circuit 102 and transmitting sensed power information to the outside of the circuit breaker unit through the door 102.

Magnetic sensor 210 may be placed in the proximity of conductor 108 (e.g., near or on the face 109 of the circuit breaker 108) to detect the magnetic field produced by conductor 108. As used in this context, the term "proximity" means that the magnetic sensor 210 is close enough to produce a sensed signal suitable for power monitoring. In some embodiments, magnetic sensor 210 may be positioned in contact with the face 109 of the circuit breaker 104. Positioning the magnetic sensor 210 as close as possible to the conductor 108 may increase the magnitude of the detected signal. However, it should be appreciated that suitable detection can also be obtained when the magnetic sensor is positioned farther from conductor 108. For example, the magnetic sensor 210 may be displaced from the face of the circuit breaker 104 in the direction of the door 102, and/or displaced along the face of the circuit breaker to the side of the conductor 108. Various positions of magnetic sensor 210 may produce a sensed signal suitable for power monitoring.

Magnetic sensor 210 may include a coil of wire that generates a signal in response to the magnetic flux through the coil. Advantageously, the coil need not be wrapped around conductor 108, which could require taking apart the circuit breaker panel. As shown in FIG. 2, the coil may be placed beside conductor 108, outside of the circuit breaker 104. No wiring changes are required to the circuit breaker 104 or to any other wiring in the region of the circuit breaker unit 100 behind the circuit breaker panel 103.

In some embodiments, magnetic sensor 210 may include a core of high-permeability magnetic material, such as ferrite, for example. The coil of wire may be wound around the core to focus the magnetic flux through the coil. A variety of magnetic sensor configurations may be used to sense the magnetic field produced by conductor 108, as various inventive embodiments according to the present disclosure are not limited in this respect.

Transmitting the information sensed by magnetic sensor 210 to the outside of the circuit breaker unit 100 may in some instances pose various challenges. For example, typical circuit breaker units do not have a DC power source between the circuit breakers and the breaker unit door that could be used to power signal transmission equipment. Providing a DC power supply in this region may not be allowed by safety regulations. Additionally, available space may be limited/constrained in the region between the circuit breaker panel 103 and the breaker unit door 102.

According to some embodiments, system 200 can transfer the sensed power information to the outside of circuit breaker unit 100 using a magnetic link through the circuit breaker unit door 102. Drive/sense circuit 202 may generate an AC carrier signal that drives the outer magnetic coupler 204. In some embodiments, an AC carrier signal may have approximately the waveform of a sine wave, and a frequency in the range of 1 kHz to 1 MHz, e.g., 10 kHz. However, it should be appreciated that various other waveforms and carrier frequencies may be used, as various inventive embodiments according to the present disclosure are not limited in this respect.

In response to the AC carrier signal, outer magnetic coupler 204 generates a magnetic field that passes through the door 102 to the inner magnetic coupler 206. In response to the generated magnetic field, inner magnetic coupler 206 produces a time-varying voltage at the carrier frequency (e.g., 10 kHz) that then serves as a regenerated carrier signal 214 on the inside of circuit breaker unit 100. If the door 102 is made of steel, the high magnetic permeability of the steel may tend to reduce the coupling between the inner and outer magnetic couplers. When transmitting the signal through a steel door, the inner and outer magnetic couplers may be modeled as a loosely-coupled transformer, as discussed below.

Inner magnetic coupler 206 may provide the regenerated carrier signal 214 to mixer circuit 208. Mixer circuit 208 may also receive a power monitoring signal 212 sensed by magnetic sensor 210. In some embodiments, mixer circuit 208 modulates the current through the inner magnetic coupler 206 in response to the power monitoring signal from magnetic sensor 210. The power monitoring signal may have the same frequency as the line frequency of the monitored current, e.g., 50 Hz, 60 Hz or 400 Hz. Mixer circuit 208 can produce a modulated current signal in which the carrier signal (e.g., at a frequency of 10 kHz) is amplitude modulated by the power monitoring signal (e.g., at a frequency of 60 Hz).

In some embodiments, mixer circuit 208 may be modeled as a variable resistor that changes resistance in response to the power monitoring signal sensed by magnetic sensor 210. Mixer circuit 208 may act as a variable load on the inner magnetic coupler 206, causing the current through inner magnetic coupler 206 to change in response to the power monitoring signal from magnetic sensor 210. The time-varying change in load on the inner magnetic coupler 206 changes the load on the outer magnetic coupler 204 and the drive/sense circuit 202. When less current is drawn by the inner magnetic coupler 206, less current is drawn by outer magnetic coupler 204. Conversely, when more current is drawn by the inner magnetic coupler 206, more current is drawn by outer magnetic coupler 204. The current through the outer magnetic coupler 204 can be measured by drive/sense circuit 202 to detect the modulated power monitoring signal from mixer circuit 208. Signal processing circuitry can demodulate the received signal to detect the power and/or current flowing through the circuit breaker.

An advantage of the techniques described herein is that the current through a circuit breaker can be monitored without any changes to the hardware of the circuit breaker or circuit breaker unit. No wiring modifications are necessary to the incoming or outgoing circuit breaker power conductors. Thus, in some embodiments, a power monitoring system employing the methods and apparatus described herein may be installed (e.g., retrofit into an existing circuit breaker) without the need for an electrician or other skilled labor. However, it should be appreciated that changes to the wiring or hardware optionally may be made, if desired. Another advantage is that power monitoring can be performed while the circuit breaker unit door 102 is closed, which may be required for compliance with safety regulations in some locations.

Various aspects of the components of power monitoring system 200 will now be discussed in the context of various embodiments. These embodiments are discussed merely by way of example, and are not intended to be limiting.

Mixer Circuit

Figure 3B:
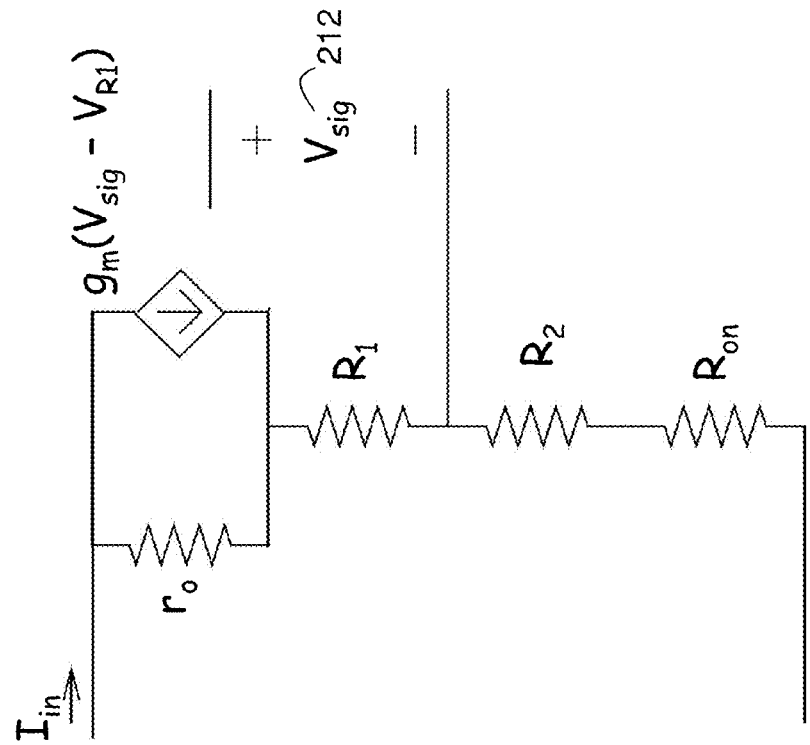
FIG. 3 shows a mixer circuit and its small signal model, according to some embodiments.
Figure 3A:
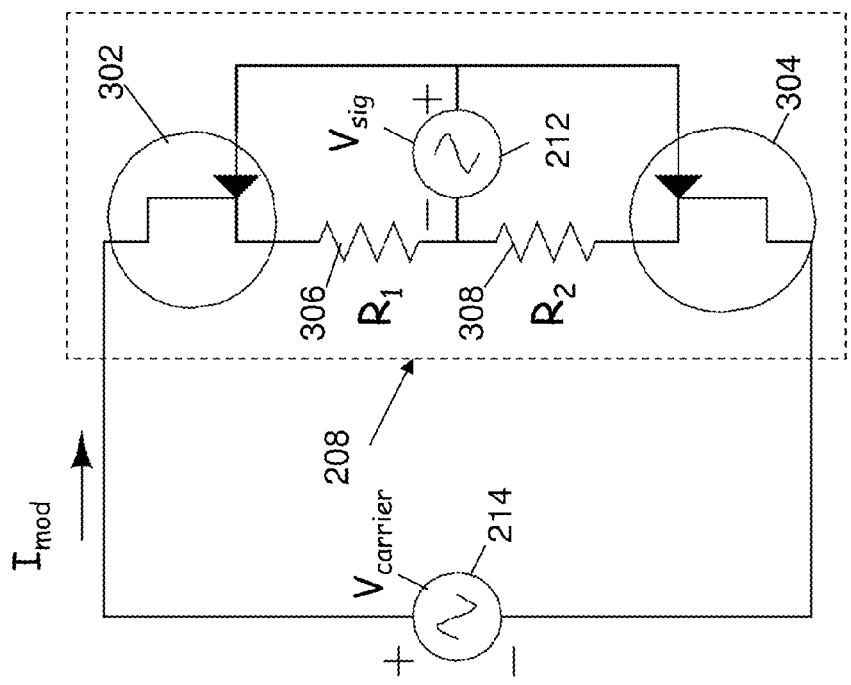

FIG. 3A shows a schematic of a mixer circuit 208, according to some embodiments. Mixer circuit 208 can be formed as a four-quadrant balanced JFET modulator. As discussed above, mixer circuit 208 may be positioned in the region between the circuit breaker panel 103 and the breaker unit door 102. Mixer circuit 208 may be configured to modulate a received carrier signal with the sensed power monitoring signal. Mixer circuit 208 may require only a minimal amount of circuitry inside the breaker door, and may provide a low-cost solution.

Mixer circuit 208 may include two n-channel junction field effect transistors (JFETs) 302 and 304 for modulation control, and two resistors 306 and 308 to improve linearity. As shown in FIG. 3A, JFET 302 is coupled to resistor 306. Resistor 306 is coupled to a first terminal of the detected power monitoring signal 212 ($V_{sig}$) from magnetic sensor 210. Resistor 308 is coupled to resistor 306 and the first terminal of $V_{sig}$. JFET 304 is coupled to resistor 308. The gates of JFETS 302 and 304 are both coupled to a second terminal of the detected power monitoring signal $V_{sig}$.

JFET 302 may be coupled to a first terminal of the inner magnetic coupler 206 and JFET 304 may be coupled to the second terminal of the inner magnetic sensor element 206. The inner magnetic coupler 206 may produce a regenerated carrier voltage $V_{carrier}$ between its first and second terminals in response to the magnetic field generated by the outer magnetic coupler 204. The voltage $V_{carrier}$ may produce a modulation current $I_{mod}$ that changes based on the resistance of mixer circuit 208. The detected power monitoring signal $V_{sig}$ is provided to the gates of JFETs 302 and 304 to modulate their resistances. Mixer circuit 208 may be modeled as a variable resistor that changes its resistance in response to the detected power monitoring signal $V_{sig}$. The current $I_{mod}$ through mixer circuit 208 and inner magnetic coupler 206 changes in response to the variable resistance of mixer circuit 208. The carrier signal received by inner magnetic coupler is thereby modulated in response to the detected power monitoring signal $V_{sig}$.

An n-channel JFET is a three-terminal transistor having drain and source conduction terminals and a gate control terminal. The n-channel JFET is a normally-on device that has its resistance increased by the application of a negative gate-to-source voltage $V_{gs}$. An n-channel JFET may be a symmetric device in which the drain and source are interchangeable. By convention, the source is considered to be the terminal of the JFET at a lower potential than that of the drain.

The operation of mixer circuit 208 will now be described with reference to the half-cycles of the voltage $V_{carrier}$.

On positive half cycles ($V_{carrier}>0$), the source of each JFET 302 and 304 is the lower terminal of the JFET and the drain is the upper terminal of the JFET. The detected power monitoring signal $V_{sig}$ is referenced to the midpoint of the balanced modulator. The gate-source voltage of JFET 304 is the positive-valued drain-source voltage of JFET 304 added to the positive-valued voltage drop across resistor 308 and $V_{sig}$. Since $V_{sig}$ may have a small value, JFET 304 may maintain a positive gate-source voltage for most or all of the positive half cycle of $V_{carrier}$. Thus, JFET 304 may be fully turned on during positive half cycles of $V_{carrier}$, and can be modeled as a small resistance.

The lower terminal of JFET 302 connected to resistor 306 can be considered to be the source terminal of the JFET 302 for positive half cycles of the voltage $V_{carrier}$. JFET 302 has a gate to source voltage that is $V_{sig}$ minus the positive voltage drop across resistor 306 ($V_{sig}-V_R$). Since $V_{sig}$ may have a small value, the JFET 302 has a gate-source voltage that may not be strictly positive. As a result, JFET 302 is controlled in response to the sensed power monitoring signal $V_{sig}$. As long as the resistance of resistor 306 is large enough, $V_R$ will be less than $V_{sig}$, keeping the JFET device controlled by the voltage $V_{sig}$. Approximating $V_{gs}$ of the JFET 302 as a constant, the current through JFET 302 can be expressed as $$\frac{V_R}{R} = \frac{V_{sig} - V_{gs}}{R}.$$

The mixer circuit is adaptively-referencing because during both positive and negative half-cycles of $V_{carrier}$, one JFET is fully-on, referencing the source of the other JFET to the low-potential end of the mixer circuit.

During negative half-cycles of the voltage $V_{carrier}$, the mixer circuit functions similarly with the roles of the JFETs reversed. During a negative half-cycle, JFET 302 is fully turned on and the resistance of JFET 304 is controlled by the voltage $V_{sig}$. The symmetric nature of the mixer circuit 208 permits control during both half cycles of the applied voltage $V_{carrier}$. Square wave multiplication of the signals $V_{carrier}$ and $V_{sig}$ is achieved because the sign of the mixer current matches the sign of the carrier signal, while the amplitude is determined by the detected power monitoring signal $V_{sig}$. The envelope of the regenerated carrier signal 214 varies according to the amplitude modulation by $V_{sig}$. The shape of the resulting waveform can be expressed as $$R(t)=\cos(\omega_c t)(A+M\cos(\omega_m t)),$$

with $\omega_c$ being the carrier frequency, A being the remaining carrier amplitude, and M being the modulation amplitude. Some higher frequency terms may appear as a result of this modulation, but with appropriate demodulation the higher harmonics can be filtered away.

The resistors 306 and 308 may optionally be included in mixer 208 to limit the steady state current through the mixer circuit 208 and improve the linearity of the response to the control voltage $V_{sig}$. It is appreciated that improving the linearity of the mixer circuit using resistors 306 and 308 may come at the cost of reduced gain. These two concerns may be balanced in view of the requirements of a particular application by changing the resistance of the resistors 306 and 308.

A small signal analysis of the circuit will now be presented. The symmetry of the mixer circuit means that an examination of the circuit during one half cycle can be applied to its operation for the opposite half cycle. In this analysis, it may be assumed that the carrier voltage is well above the saturation voltage of the JFET devices and the carrier voltage makes quick zero crossings.

FIG. 3B shows a small signal equivalent model for the mixer circuit 208 during a positive half-cycle of the voltage $V_{carrier}$. Assuming a valid steady state voltage $V_{ds}$ is impressed over the JFET 302 and the voltage $V_{gs}$ is higher than its pinch-off voltage $V_p$, JFET 302 will admit a drain current $I_d$. These parameters are set by the JFET parameters, the two resistors, and the source impedance of the carrier supply. In a small signal sense, the JFET 302 can be modeled like a resistor $r_o$ in parallel with a current source having a magnitude $g_m V_{gs}$. The transconductance $g_m$ can be expressed as $g_m = \sqrt{\beta I_d}$, where $\beta$ is the JFET gain parameter. The output resistance $r_o$ is $$\frac{V_{ds} + 1/\lambda}{I_d}$$

with $\lambda$ being the channel length modulation parameter of the JFET. As discussed above, the JFET 304 can be modeled as a small resistor $R_{on}$. Resistor $R_{on}$ is assumed to be small compared to $R_1$ and $R_2$.

When the sum of $R_1$, $R_2$, and $R_{on}$ is much smaller than $r_o$, simple expressions for the gain of the mixer circuit can be derived. The transconductance source of the JFET 302 has a value of $g_m V_{gs} = g_m(V_{sig} - V_{R_1})$. If the current through $r_o$ is negligible, $V_{R_1}$ is simply the current delivered through the current source, $I_{in}$ times the resistance $R_1$ of resistor 306. Rearranging terms to solve for $$\frac{I_{in}}{V_{sig}},$$

the gain G of the circuit, yields $$G = \frac{g_m}{1 + g_m R_1}$$

As seen from the above equation, the gain can be increased by decreasing $R_1$, but doing so may reduce the linearity of the circuit.

Two device parameters that may be considered when selecting a JFET device are $\beta$ and the $V_p$. A larger $\beta$ increases $g_m$. A larger P also increases the zero input drain current $I_d$ because the JFET gate is farther away from pinchoff. $V_p$ is negative in JFET devices. Larger $V_p$ values may require a larger voltage $V_{ds}$ values to maintain saturation. Operating under the assumption that $g_m*R_1 \ll 1$, the gain is proportional to $g_m$. With some manipulation and removal of higher order terms, it can be shown that $g_m$ is proportional to $-V_p \beta/R_1$. Further assuming that $R_{on}$ is smaller than $R_1$ and $R_1 = R_2$, we find that $V_{in} > -V_p(\beta+1)$. Based on this result, a good JFET for this application may have a small $V_p$ and large $\beta$. The power available is essentially set by the power transmitted by the carrier through the door. One solution is to use this available power with the highest $I_D$ possible while maintaining saturation voltage across the JFETs.

In some embodiments, suitable devices are PN4117A JFET devices from Fairchild Semiconductor. These JFET devices have very small $V_p$ and a modest $\beta$. These have a $V_p$ between −0.6 and −1.8 volts and a common source forward transconductance of 70 to 210 ms. 1.2 kΩ resistors may be used as resistors 306 and 308 to improve linearity.

Inductive Link

FIG. 2 shows that the inductive link through the circuit breaker door 102 includes an outer magnetic coupler 204 and an inner magnetic coupler 206. As discussed above, each of magnetic couplers 204 and 206 may include a coil for inductively coupling signals through the circuit breaker door 102. Magnetic couplers 204 and 206 may form a loosely coupled transformer having a $N_1:N_2$ turns ratio, where $N_1$ is the number of turns in the coil of the outer magnetic coupler 204 and $N_2$ is the number of turns in the coil of the inner magnetic coupler 206.

Figure 4:
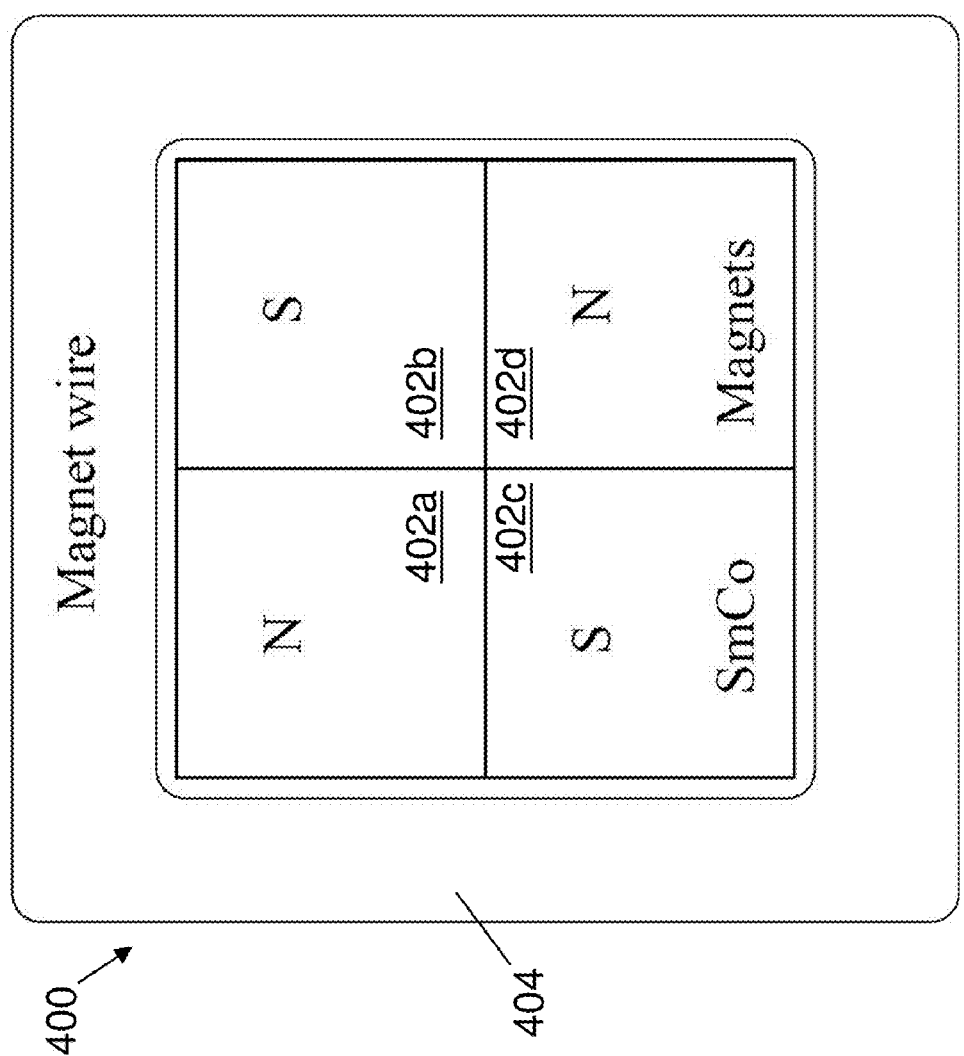
FIG. 4 shows a magnetic coupler, in accordance with some embodiments.

FIG. 4 shows an embodiment of a magnetic coupler 400 suitable for use as magnetic coupler 204 and/or 206. In some embodiments, the coil for magnetic coupler 204 and/or 206 may be wrapped around one or more magnets. Magnetic coupler 400 includes four magnets 402 having poles that alternate between north and south. A coil of magnet wire 404 is wrapped around the magnets 402.

In some embodiments, magnets 402 can be powerful magnets formed of a strongly magnetized material, such as samarium cobalt. In some embodiments, the magnets may provide a convenient means of securing the magnetic coupler to the steel door. Using powerful magnets can also alter the permeability of a ferromagnetic material, such as steel, by at least partially saturating the magnetic domains therein, improving the magnetic coupling through the door. In some embodiments, a magnet material other than samarium cobalt may be used, such as neodymium. When selecting a magnet material, it may be desirable to select a material with a low electrical conductivity to reduce eddy current losses.

Figure 5:
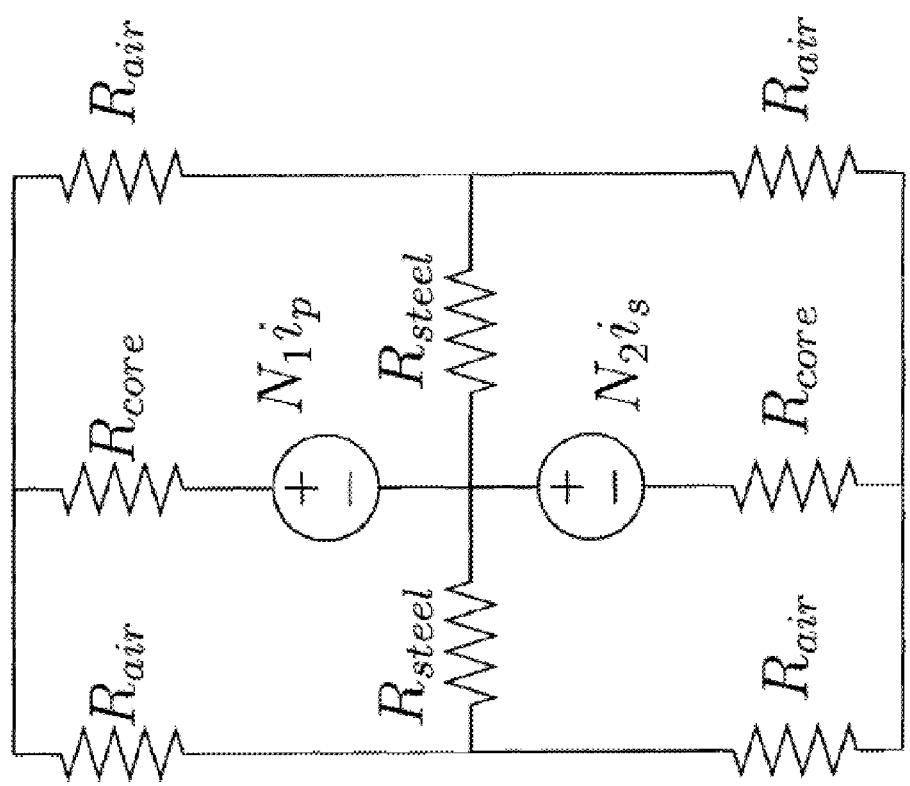
FIG. 5 shows a reluctance model for the magnetic coupling between the inner and outer magnetic couplers through the circuit breaker unit door.

A reluctance model of the core can be used to better understand the effects of flux leakage on the inductive link. To a first approximation, the reluctance model can be represented by the magnetic circuit shown in FIG. 5. Reluctance is a properly representing the tendency for magnetic flux to flow through a region. The concept of reluctance is analagous to the concept of electrical resistance. Reluctance may be expressed as $$R = \frac{l}{\mu A},$$

where l is the magnetic path length, A is the magnetic area and $\mu$ is the magnetic permeability. The magnetic analogue of electromotive force (voltage) is magnetomotive force (MMF). In FIG. 5, the MMF sources $N_1 I_p$ and $N_2 I_s$ model the effects of the outer and inner magnetic couplers, respectively. The reluctances $R_{core}$ represent the reluctance of the magnets on each side of the door 102. The reluctance $R_{air}$ represents the flux path through the air around the two magnetic couplers. The reluctance $R_{steel}$ represents the path through the steel between the coils. Note that the mutual path linking the two coils is through both $R_{core}$ and $R_{air}$, two reluctances that are relatively large. This path is in parallel with a shunt path consisting of low reluctance steel $R_{steel}$. As a result, most of the magnetic flux will flow across this low reluctance parallel path.

It has been shown that steel becomes less permeable at higher frequencies, with $R_{steel}$ being strongly frequency dependent. $R_{steel}$ increases with frequency as the magnetic permeability of the steel decreases. However, at higher frequencies, the eddy currents of the steel can become significant, and at a high enough frequency the magnetic flux can be effectively rejected from the steel by eddy currents. The permeability of the steel will approach that of air at that time. There may be an optimum frequency reflecting a balance between the shielding due to high-frequency eddy currents and reduced low-frequency magnetic permeability.

The use of magnets 402 can further decrease the permeability of the steel by at least partially saturating it. In the reluctance model of FIG. 4, the use of magnets 402 increases $R_{steel}$ by making a return path along the steel door have higher reluctance. This also increases $R_{core}$, but the thickness of the steel door relative to the radius of the coil may be very small. This tends to allow a lower carrier frequency. As discussed above, a lower carrier frequency (e.g., in a range of approximately 100 kHz-500 kHz) may be desirable because it leads to less eddy current loss.

The dimensions of the coil 404 can affect the reluctance model. A coil with a larger radius may be more effective because it will increase the inductance of the coil directly. Also, as discussed above, saturating the steel can improve performance because the radius of the coil is large compared to the thickness of the door. Making the coil flat may also be more effective because it makes the mutual path linking the two coils shorter and broader. In view of these considerations, one may choose to make the coil as broad and flat as is practical. However, it should be appreciated that a narrower coil and/or a non-flat coil may be desirable for some designs.

In some embodiments, a suitable coil may have a rectangular shape. The dimensions of the coil may be approximately 3 in.×3 in. in the plane of the coil, and having a thickness of approximately ½ in. As discussed above, performance improvements may be possible if the coil is enlarged so that it is as broad as the circuit breaker unit door will allow (e.g., 15 in.×10 in.) and as flat as possible given the number of windings and the gauge of the wire. However, any suitable coil dimensions may be used.

Figure 6:
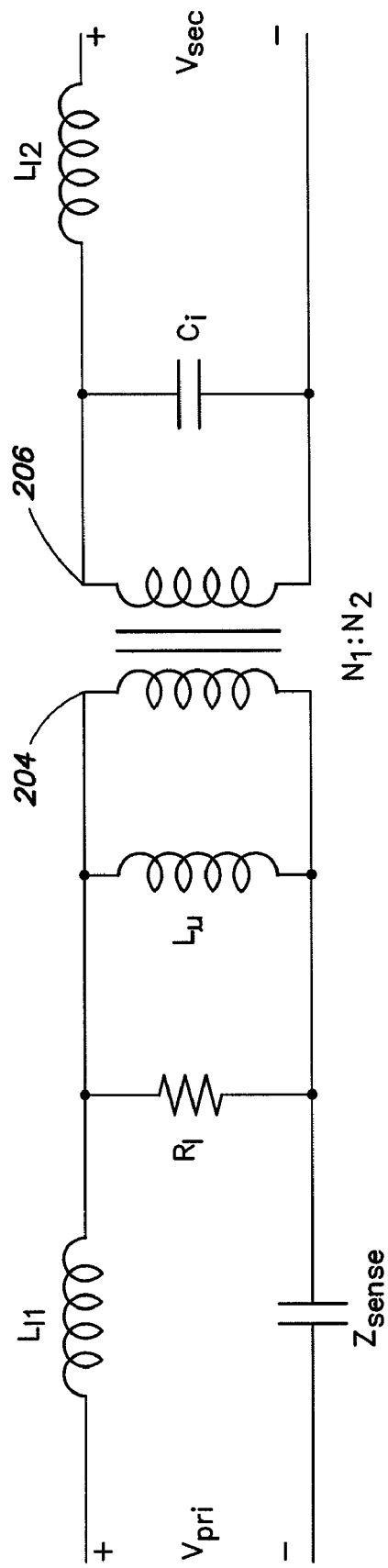
FIG. 6 shows a transformer model for the coupling between the inner and outer magnetic couplers through the circuit breaker unit door.

FIG. 6 shows a transformer model of the magnetic link between magnetic couplers 204 and 206, according to some embodiments. The loose coupling of the coil system is represented very large leakage inductance terms ($L_{l1}$ and $L_{l2}$) and a very small magnetizing inductance ($L_\mu$) because of the significant leakage. Core eddy current loss in the door in this model is a shunt resistor ($R_l$) in parallel with the small magnetizing inductance. This means that at high frequencies, most of the voltage applied may be across the leakage inductance and not transferred through the magnetizing inductance. In addition, there may be an interwinding capacitance component $C_i$ that makes the system self-resonant at a certain frequency. In this electrical transformer model, an optimal frequency may occur when the loss resistor impedance matches the magnetizing impedance at the carrier frequency and is as large as possible. In some embodiments this optimal carrier frequency may be used, although a variety of carrier frequencies may be suitable.

Finding the optimal carrier frequency can be a non-trivial matter that is complicated by interrelationships between the door and the coil geometry. The ideal frequency can be a function of the door material properties, the dimensions of the coils, and the thickness of the door. Computer modeling of this system to find the ideal frequency may be difficult when strong magnets are used. Saturation of magnetic core materials is typically poorly modeled, and the frequency dependence of steel electrical properties is poorly understood. Software modeling was used to gain an intuitive understanding of the problem, and experimentation was used to find an empirical solution.

A large turns ratio, $$\frac{N_2}{N_1}$$

may be chosen to yield a large voltage gain for the signal $V_{carrier}$ received at the inner magnetic coupler 206 to develop a high enough drain-source voltage for the JFET devices in the mixer circuit 208. Another advantage of using a large turns ratio is that it amplifies the current drawn by the mixer circuit 208 as seen from the outer magnetic coupler 204. To provide a large turns ratio, the coil of the inner magnetic coupler 206 may be formed using as many turns of wire as possible. Since there may be little current flowing through the inner magnetic coupler 206, a fine gauge of magnet wire may be used. The number of turns in the coil of the outer magnetic coupler 204 may be lower-bounded by the current drive capability of the drive/sense circuit 202. The coil for the outer magnetic coupler 204 may be constructed of thick enough wire and wound with enough turns to match the output impedance of drive/sense circuit 202.

Since the system may mainly operate at the carrier frequency, the impedance challenges of driving the coil can be addressed through resonance. A high number of turns inside the door may be advantageous for the functioning of the circuit, but also may lead to high interwinding capacitance parasitics, shown in FIG. 6 as $C_i$. This parasitic capacitance can be used advantageously by recognizing that it provides a parallel self-resonance for the coil of the inner magnetic coupler 206. Driving the system at approximately that resonance frequency can yield more voltage gain on the secondary that helps establish the appropriate operating voltage for mixer circuit 208. The addition of a series capacitor which forms $Z_{sense}$ on the primary can match the two coils at the operating frequency to provide maximum signal transfer. In this way, the high leakage of the magnetic link can be mitigated from each side of the transformer. Additionally, the capacitor $Z_{sense}$ may provide a useful sense impedance for measuring the current drawn by the coils. Even though $Z_{sense}$ may be the impedance of a capacitor, and therefore frequency-dependent, the signal of interest (e.g., at a frequency of 60 Hz) may be a narrowband signal with respect to the carrier frequency of the signal driving the impedance $Z_{sense}$. Therefore, the impedance $Z_{sense}$ is approximately constant over the modulated frequency range $f_{carrier}$+/−60 Hz, for example. The resonant capacitor impedance of $C_i$ may be matched to the winding impedance for good signal transfer.

The magnetic link between the magnetic couplers 204 and 206 may be formed through any of a variety of materials. In some of the inventive embodiments disclosed herein, the magnetic link may be through a circuit breaker door that is formed of a ferromagnetic material, such as steel. In other inventive embodiments, the link may pass through a region with a variety of electrical and/or magnetic properties including insulating, conductive, magnetic, ferromagnetic and/or ferrimagnetic properties, or a combination thereof. The carrier frequency may be optimized based on the material between the two windings comprising the through-door inductive link. When conductive materials, such as steel, are present in the link path, high carrier frequencies may produce significant eddy current losses and skin effect shielding in the conductive region. Thus, a lower carrier frequency may be chosen for a conductive material than an insulating material with similar properties. A relatively low carrier frequency may be desirable for a non-magnetic conductive material (e.g., 1 kHz). With a ferromagnetic material, the permeability may be lower at higher frequencies, which may provide increased coupling. Thus, a higher carrier frequency may be chosen for a ferromagnetic material. For a conducting, ferromagnetic material such as steel, the carrier frequency may be most suitable when the simultaneous shielding effects of the permeability and eddy current losses has been minimized, which may occur in the range of about 100 kHz-500 kHz. For a ferromagnetic material with insulating properties, a high frequency may be chosen, such as 1 MHz or greater, for example. However, it should be appreciated that various other carrier frequencies may be used, as various inventive embodiments according to the present disclosure are not limited in this respect. These frequency selections may be further constrained by the available supporting circuitry and associated design parameters.

Magnetic Sensor

As discussed above, the current path inside a typical circuit breaker passes by the lower face of the circuit breaker, as illustrated in FIG. 1C and FIG. 2. In some embodiments, the magnetic sensor 210 is designed to focus and sense the magnetic field produced by conductor 308.

Figure 7:
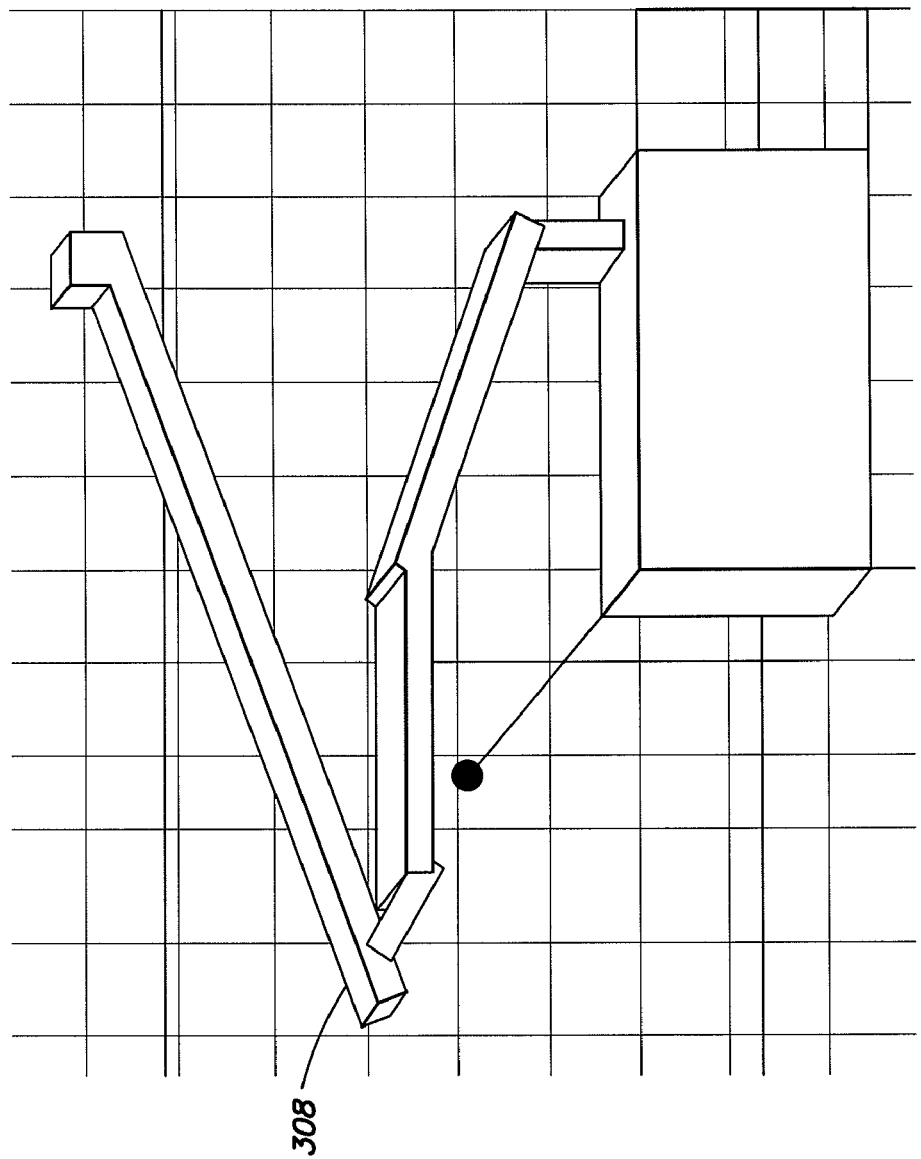
FIG. 7 shows a finite element model of the conductor within a circuit breaker.
Figure 8:
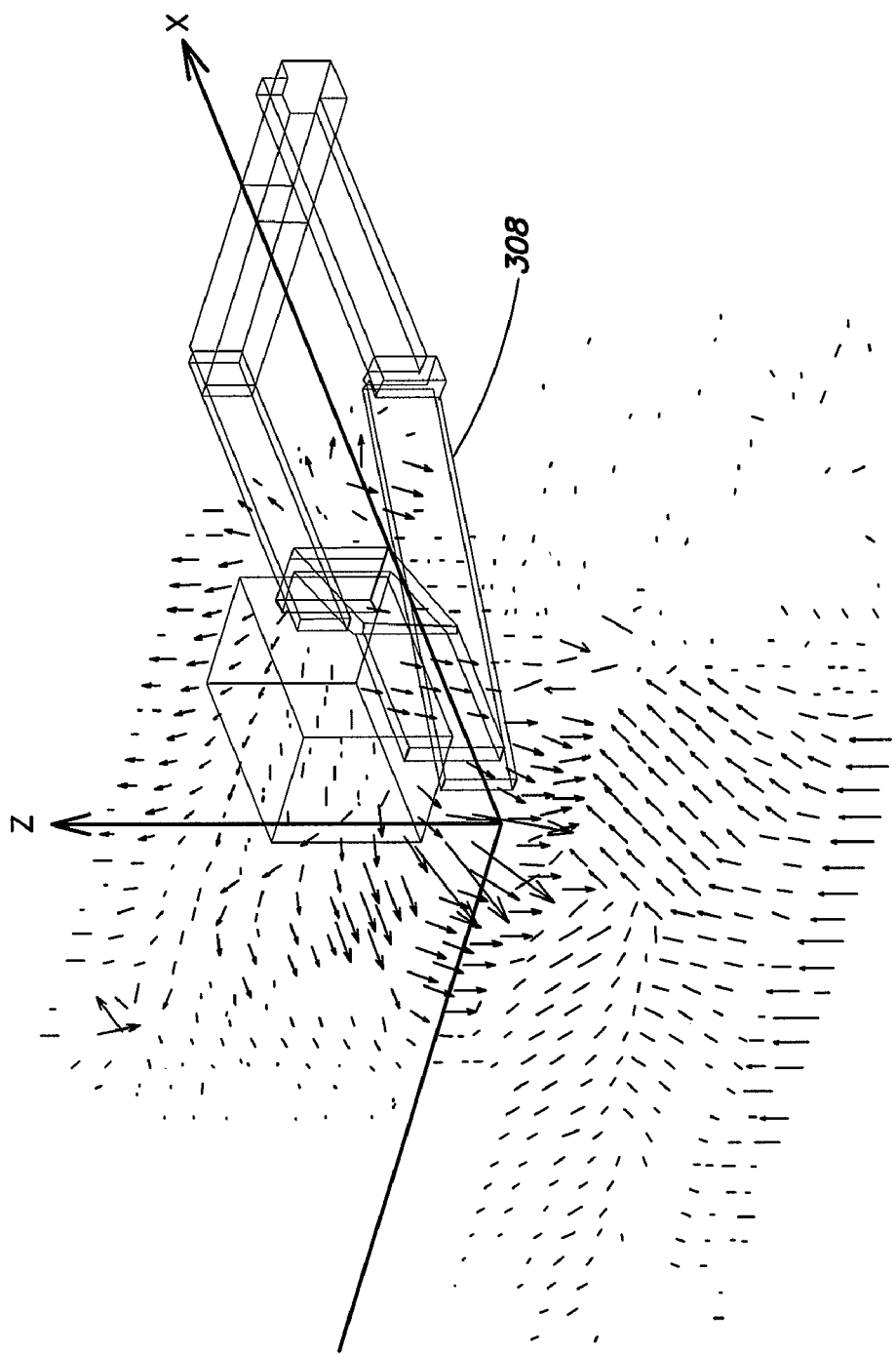
FIG. 8 shows the result of simulating the magnetic field using the finite element model.

Finite element analysis was used to model the conductor 308 to identify an appropriate position for the magnetic sensor. FIG. 7 shows the finite element model of the conductor 308. FIG. 8 shows the magnetic field produced by simulation of this model. The magnetic field vectors shown in FIG. 8 are in the plane of the face of the circuit breaker. The predominant flow of current through the circuit breaker is from top to bottom in FIG. 7, so the magnetic fields wrap around the conductor 308 across the breaker face. The finite element simulation showed that the field at the surface strongly resembles the field produced by a point current source at the depth of the conductor 308. The finite element simulation confirmed that a preferred position for the magnetic sensor is at the surface of the circuit breaker where the conductor is closest to the breaker face. At that point the magnetic field is strongest and most uniform. However, it should be appreciated that the magnetic field may be sensed in another location, as various inventive embodiments are not limited in this respect.

Figure 9:
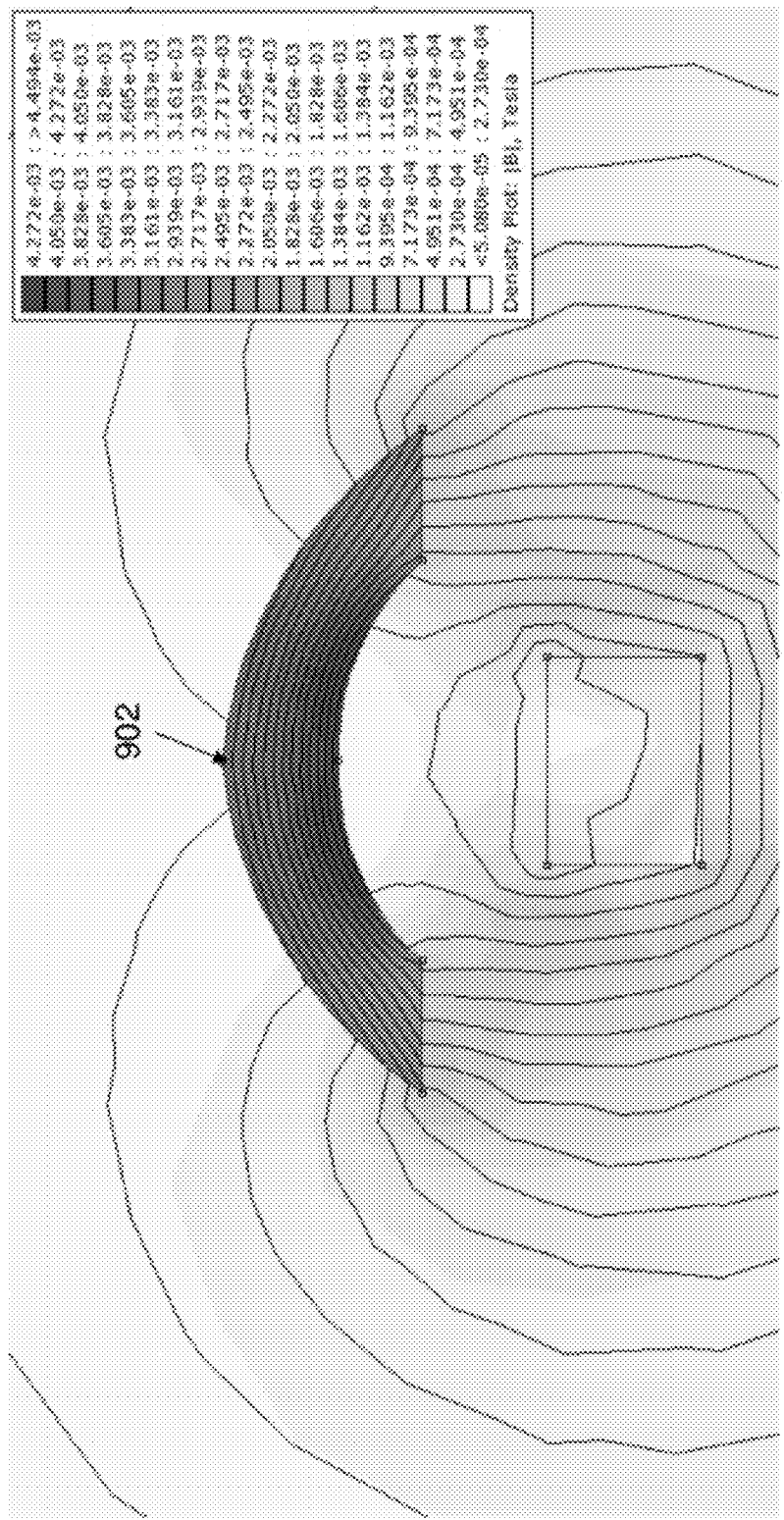
FIG. 9 shows a simulation of the magnetic flux at the magnetic sensor.

In some embodiments, the magnetic sensor may be designed to focus as much magnetic flux into itself as possible. A core 902 of high permeability magnetic material may be used to focus the magnetic flux. To improve the flux focusing, the core may be designed to roughly follow the shape of the magnetic field at the face of the breaker. In some embodiments, a half toroid of high permeability material placed on the breaker face may result in significant flux-focusing. FIG. 9 shows the results of a finite element simulation in with a half-toroid shaped core 902 is used to focus the magnetic flux. A coil of wire may be wound around the core 902 to produce a voltage signal $V_{sig}$ representative of the power flowing through conductor 308.

Figure 10:
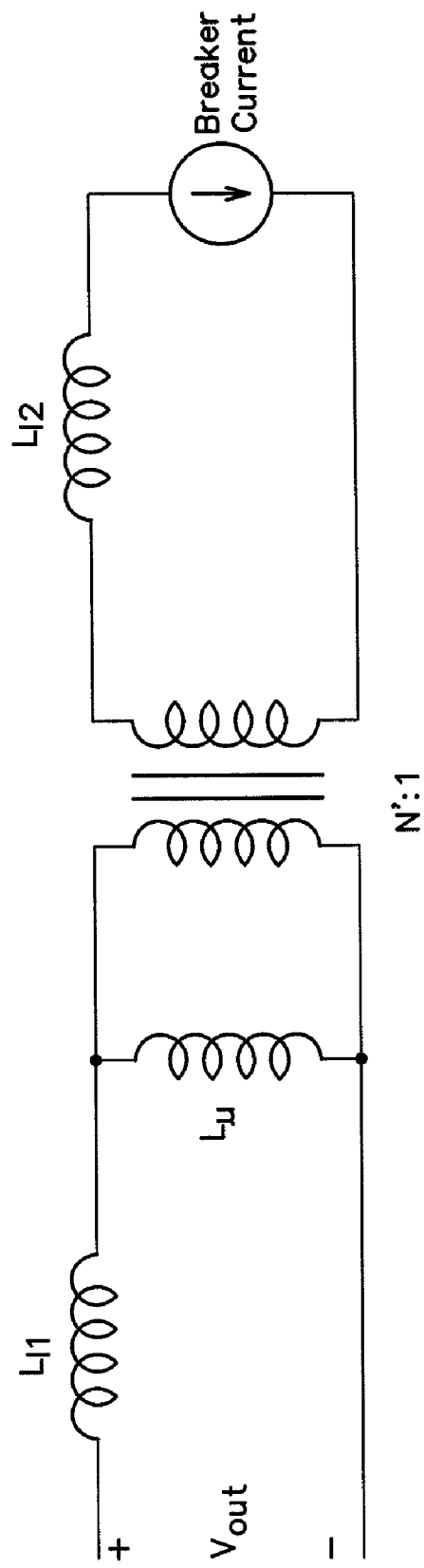
FIG. 10 shows a circuit model of the magnetic sensor.

When the pickup coil has N turns of wire, the magnetic sensor can be modeled as a 1:N' step up transformer with poor magnetic coupling to the conductor 308, as shown in FIG. 10. The variable N', where N'<N, may be used to model the poor magnetic coupling from the breaker to the N turn windings. The current through the breaker may be modeled as driving a single turn of a 1:N' turn virtual transformer. The leakage inductances $L_{l1}$ and $L_{l2}$ of the transformer may be large because a large portion of the magnetic path consists of air instead of a material with high magnetic permeability. The magnetic sensor is connected to stages that measure open circuit voltage and do not load it significantly. In the model of FIG. 10, the breaker pickup response is a voltage proportional to both the breaker current and the breaker current frequency: $V_{out} \propto 2\pi j\omega L_\mu I_{in}$, where $L_\mu$ is the magnetizing inductance, $L_{l2}$ is the secondary leakage inductance, $\omega$ is the breaker current frequency and $I_{in}$ is the breaker current magnitude. From this equation it is clear that $V_{out}$ is a function of both $I_{in}$ and $\omega$. Based on the equation, it can be seen that a higher $L_\mu$ will lead to a higher output voltage. One way to increase magnetizing inductance is to add more turns to the magnetic sensor coil. Having a high magnetizing inductance can prevent shorting out the signal to be measured. Sensing a 60 Hz breaker signal may require a high inductance for the impedance at that frequency to become appreciable i.e., $Z_\mu = \omega L_\mu$ will be small when $\omega = 2\pi * 60$. A very fine wire gauge may be used because its series resistance will not impact a voltage measurement of the coil. Using a high permeability material for the toroid and matching the shape of the toroid to the natural magnetic field lines may make N' approach the true number of turns N. Increasing the cross sectional area of the toroid may increase the flux it can capture, and thereby improve the magnetic coupling. The coupling is affected by the geometry of both the pickup and breaker.

In one embodiment, a Ferroxcube part TX25/15/10-3E6 was used with 1200 turns of 34 AWG magnet wire. The toroid has a 25 mm outer diameter, a 15 mm inner diameter, and a 10 mm thickness. This toroid was cut in half on a diamond band saw, and the two halves were glued together side by side to increase cross sectional area. This toroid has a very high relative permeability of approximately $10000\mu_0$. The magnetic sensor may be secured to the face of the breaker using electrical tape, although more sophisticated mechanical connections may be used that are self-supporting and/or self-aligning.

In some embodiments, a differential sensor configuration may be used to cancel out unwanted magnetic fields while sensing the desired magnetic field. One example of a differential sensor configuration uses two coils: a first coil wound around a first leg of the half-toroid and a second coil wound around a second leg of the half-toroid. The signals produced by the first and second coils can be added together (e.g., in series) so that the desired signals resulting from the circuit breaker's magnetic field add together constructively, and undesired magnetic fields cancel out. A differential sensor configuration may cancel out magnetic fields generated by other circuit breakers within the same circuit breaker unit, so that only the magnetic field at the desired circuit breaker is sensed.

The voltage signal produced by this pickup may be too small to drive the mixer circuit 208 at small current signal levels. To increase the voltage, 1:14.1 step-up audio transformer module may be added between the JFET mixer and the pickup. The audio transformer works at low frequencies and has enough turns that its own magnetizing inductance does not significantly load down the pickup coils at a power supply frequency such as 60 Hz.

An additional resonant capacitor may be added to the audio step up transformer to boost signal levels at the cost of distortion. Normally, resonating with a small inductor at low frequency would require a large capacitor. In this case, the inductor is reflected across the transformer, increasing its apparent impedance by the square of the turns ratio. This may allow for a smaller capacitor size when added to the transformer secondary. The capacitor value may be chosen to resonate with the parallel combination of the magnetizing inductance of the audio transformer and the reflected inductance of the pickup. This method can provide more voltage gain at the 60 Hz signal frequency while attenuating the higher harmonics that may be important to NILM function.

They may also introduce a 180 degree phase shift. In some embodiments, two 0.47 µF capacitors may be placed in parallel with the secondary of the transformer.

The inventors have recognized and appreciated that some circuit breakers may have a different configuration. For example, in some circuit breakers (e.g., contactors), the current-carrying conductor may not approach the circuit breaker face. In such circuit breakers, the magnetic field can be detected by configuring/positioning one or more magnetic field sensors (e.g., coils) based on the shape of the magnetic field produced by the current-carrying conductor. For example, the magnetic sensor(s) may be positioned at an accessible location at which the magnetic field is strongest and/or most uniform.

Drive and Sense Circuit

Drive/sense circuit 202 may include a power front-end for driving the outer magnetic coupler 204, an analog filter chain responsible for receiving and demodulating the sensed signal, and a DSP for performing post processing and filtering. Drive/sense circuit 202 may be coupled to a computer or other circuitry to perform power monitoring analysis on the received signal.

Power Front-End

The power front-end may produce the carrier signal that is applied to outer magnetic sensor element 204. In some embodiments, the power front-end may include a push-pull driver having two bipolar junction transistors (BJTs) capable of withstanding high voltage and delivering sufficient current. The bases of these BJTs may be driven using a high voltage decompensated operational amplifier in a high gain configuration. A square wave at the carrier frequency can be AC coupled to the noninverting input of the amplifier. The operational amplifier may increase the voltage to a level suitable for driving the push-pull amplifier.

The push-pull driver may be connected to the series combination of the coil of the outer magnetic coupler and two sense impedances. These sense impedances can be resonant capacitors or sense resistors, for example, depending on signal requirements and a desire to accurately match impedances of the inner coil. The voltage between the two sense impedances can be used as the input to an analog filter chain for further processing. The total sense impedance is matched to the coil system at the carrier frequency, but the ratio of the two impedances is chosen to deliver acceptable voltage levels to the analog filters.

In some embodiments, the sense impedances may be formed as two 0.22 µF capacitors in series, with one of the capacitors being referenced to ground. The measured signal can be taken as the voltage across the ground-referenced capacitor, thereby resulting in a step-down ratio of two. However, it should be appreciated that various other sense impedances and configurations may be used.

Analog Filter Chain

Figure 11:
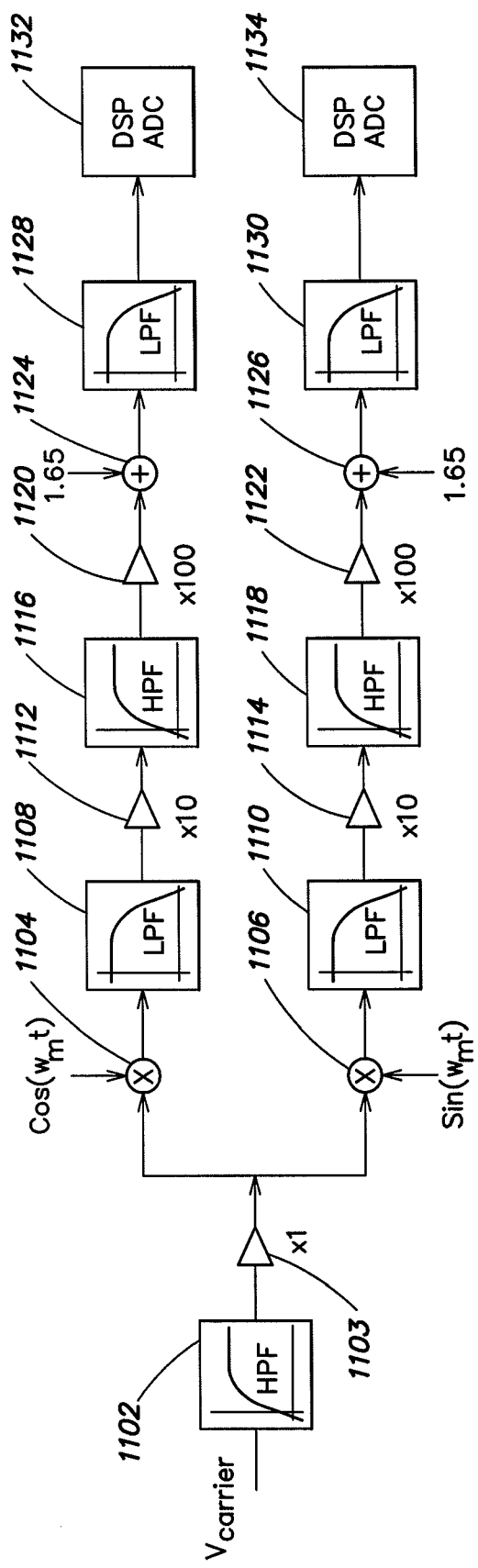
FIG. 11 shows a diagram of an analog filter chain for demodulating the received signal, according to some embodiments.

A block diagram of an analog filter chain that may be used to demodulate the received signal is shown in FIG. 11. The analog filter chain may take as its input the voltage across the coil sense impedance ($V_{sense}$) and two sine waves at the carrier frequency 90 degrees apart in phase. The multipliers 1104 and 1106 can directly multiply the sine waves by the incoming signal. In other embodiments, the multipliers 1104 and 1106 may multiply the incoming signal with two square waves 90 degrees apart.

The output of the analog filter chain are the in phase and quadrature components of the input signal (I and Q channels, or $\cos(\omega t)$ and $\sin(\omega t)$). The filter chain may operate on ±15 voltage rails, and the final output of the chain may be limited to the 0 to 3.3 Volt range of a DSP analog-to-digital converter, for example.

As shown in FIG. 11, the input voltage $V_{carrier}$ may be high-pass filtered by high pass filter 1102 to remove any DC components present in the sense voltage so that the signal includes only AC. This filtering should not distort the signal because at this stage it is modulated with the carrier, which may be at a frequency well above DC. This signal may then be amplified, if desired, so that it occupies the ±15 volt power supply range.

The incoming signal may then be demodulated using I/Q demodulation, for example. The two multipliers 1104 and 1106 may be implemented in a configuration of analog switches and independently operated from one another. In some embodiments, the multipliers may convert the sine and cosine waveforms into respective square waves at the carrier frequency, 90 degrees apart in phase, and then multiply the square waves by the incoming signal (e.g., the output of the buffer 1103). This multiplication can bring the desired signal down to baseband, but the high frequency components are still present. The remaining stages of the filter chain may perform parallel processing for the I and Q channels.

After multiplication by the I and Q demodulation signals, the incoming signals may then be lowpass filtered by lowpass filters 1108 and 1110. Lowpass filters 1108 and 1110 may be third order lowpass RC ladder filters with a cutoff of 1 kHz, for example, to attenuate high frequency content. This signal may then be passed through instrumentation amplifiers 1112 and 1114 with a gain of ten to reference the signal to the system ground while applying gain. This filtering and amplification may reduce the signal to a DC offset plus the power monitoring signal. The DC offset may represent the nonsuppressed carrier demodulated to DC.

In some embodiments, the power monitoring signal may modulate the amplitude of the carrier signal to only a small degree. To address the resulting low modulation depth, gain in the analog signal chain may be used to achieve a suitable signal-to-noise ratio (SNR) at the ADC input. At this point in the filter chain, after amplifiers 112 and 1114, the carrier has been demodulated to DC, leading to an offset. That offset may be removed with highpass filters 1116 and 1122 before amplifying the signal to prevent amplifying the offset and saturating the filter chain. The high pass filters may have their cutoffs of 10 Hz to suppress the DC offset while allowing the low frequency power monitoring signal (e.g., 50 or 60 Hz) to pass through. The signal may then be passed through amplifiers 1120 and 1122 having a gain of 100, for example. If single-ended analog-to-digital converters are used, level shifters 1124 and 1126 may adjust the signal into the proper range for the analog-to-digital converters. The level shifters 1124 and 1126 may add a DC signal, such as 1.65 volts, for example. The level-shifting can center the signal in a 0 to 3.3 Volt range for use in the analog-to-digital converter. However, it should be appreciated that other types of analog-to-digital converters may be used with different input voltage ranges, and the level shifting may be omitted or adjusted accordingly. Low pass filters 1128 and 1130 may be used as an anti-aliasing filters before providing the signals as inputs to the ADCs.

Digital Signal Processor

Any suitable digital signal processor (DSP) or other computation device may be used to perform digital processing and filtering of the incoming signals. In some embodiments, a DSP may be responsible for sampling both the I and Q channels and combining them into a demodulated signal. One suitable DSP is a dsPIC33 DSP, for example, although other DSPs may be used.

I/Q Demodulation Overview

An AM signal can have a waveform expressed by $$R(t) = A\cos(\omega_c t + \phi) + \frac{M}{2}(\cos((\omega_c + \omega_m)t + \phi) + \cos((\omega_c + \omega_m)t + \phi))$$

where $\omega_c$ is the carrier frequency, A is the carrier amplitude, M is the modulation amplitude, $\omega_m$ is the modulation frequency, and $\phi$ is arbitrary phase offset. M and $\omega_M$ can be determined using signal processing. The phase term may be unknown or time varying, so I/Q demodulation may used to detect the signal and cancel out the phase term. Alternatively, a Phase Locked Loop (PLL) could be used to demodulate the signal by locating the unknown phase and permitting synchronous detection.

For the I channel, the signal R(t) is multiplied by $\cos(\omega_c t)$, and the Q channel is multiplied by $\sin(\omega_c t)$. Each channel may then be low pass filtered to eliminate high frequency signal components. After using some trigonometric identities and assuming high frequency terms have been removed by low-pass filtering, the resulting signals can be expressed as:

$$I = \cos(-\phi)\left(\frac{M}{2}\cos(\omega_m t) + \frac{A}{2}\right)$$

$$Q = \sin(-\phi)\left(\frac{M}{2}\cos(\omega_m t) + \frac{A}{2}\right)$$

Before being sampled by the ADC, these signals may be high pass filtered to remove the A/2 DC offset. Assuming A/2 is larger than M/2, these quantities may be strictly positive or negative as determined by $\phi$. This can be the case for the above-described power monitoring system when the modulation depth is very small.

Squaring these two channels after a high pass filter, adding them, and taking the square root removes the $\phi$ terms and can recover the desired signal. However, the cosine signal has lost sign information in the operation that should be recovered. Both I and Q will follow the modulated wave and be multiplied by an unknown constant determined by $\phi$. There are at least two ways of preserving this sign information. One method involves choosing either the I or Q channel to be the sign reference. Another method involves adding an offset to both channels to ensure that they are both positive prior to calculating the square root.

The first method may lead to a problem when the magnitude of the sign reference is small. In that case, there can be uncertainty about the sign of the output, and noise can cause the signal to rapidly cross this threshold. It can also require some prior knowledge about which channel, I or Q, is the correct sign reference. Having access to the raw I and Q channels before high pass filtering is sufficient for making this determination, but it may require more ADC channels or an analog comparator that can provide digital input to the DSP.

In some embodiments, an algorithm for using this information involves reasoning about the sign of $-\phi$. I and Q can be either strictly positive or strictly negative because of the large carrier that has been demodulated to DC. If I and Q are both strictly positive, both $\cos(-\phi)$ and $\sin(-\phi)$ are positive, meaning that $-\phi$ is between 0 and 90 degrees in the first quadrant. After removing the DC offset, the I and Q channels will be in phase. I will be larger in magnitude if $-\phi$ is closer to 0 and Q will be larger if it is closer to 90. Either channel is suitable for a sign reference. The larger signal may be used because it crosses through zero faster than the other channel. A similar argument could be applied if both channels are negative and in agreement.

The problem is more complex if one channel is positive and one is negative. For example, if I is positive and Q is negative, $-\phi$ is in the fourth quadrant. This implies that $\cos(-\phi)$ is positive and that I is the "true" reference because its sign tracks the true sign. However, this also implies that Q is of the opposite sign. Again, the larger channel can be used, and the sign flipped if that is the Q channel.

The other technique of adding an offset may require less analog hardware. If the I and Q channels have a DC offset added that is different in each channel, this offset is unwanted arbitrary error in the filter chain, it could be represented by $$O_I \frac{M}{2}\cos(-\phi) \text{ and } O_Q \frac{M}{2}\sin(-\phi)$$

with $O_I$ and $O_Q$ chosen appropriately. The channels become distorted as follows.

$$I = \frac{M}{2}\cos(-\phi)(\cos(\omega_m t) + O_I)$$

$$Q = \frac{M}{2}\sin(-\phi)(\cos(\omega_m t) + O_Q)$$

When the expressions in these equations are squared and summed, the offsets generate cross terms that cause phase-dependent distortion. For this reason, the DSP may subtract out any offsets prior to squaring the incoming channels. This may be performed by median filtering the signal and subtracting out the median from all samples.

Thus, the method of adding an offset may lead to unwanted noise and distortion. It may also limit the range of the system to only half of the full bipolar range. In effect, this method may trade high noise at the zero crossings for lower noise distributed across the entire signal. Improved software and filter chains may make the sign reference method a better choice. However, it should be appreciated that any suitable technique may be used, as the invention is not limited to the particular signal processing technique selected.

Example

Figure 12:
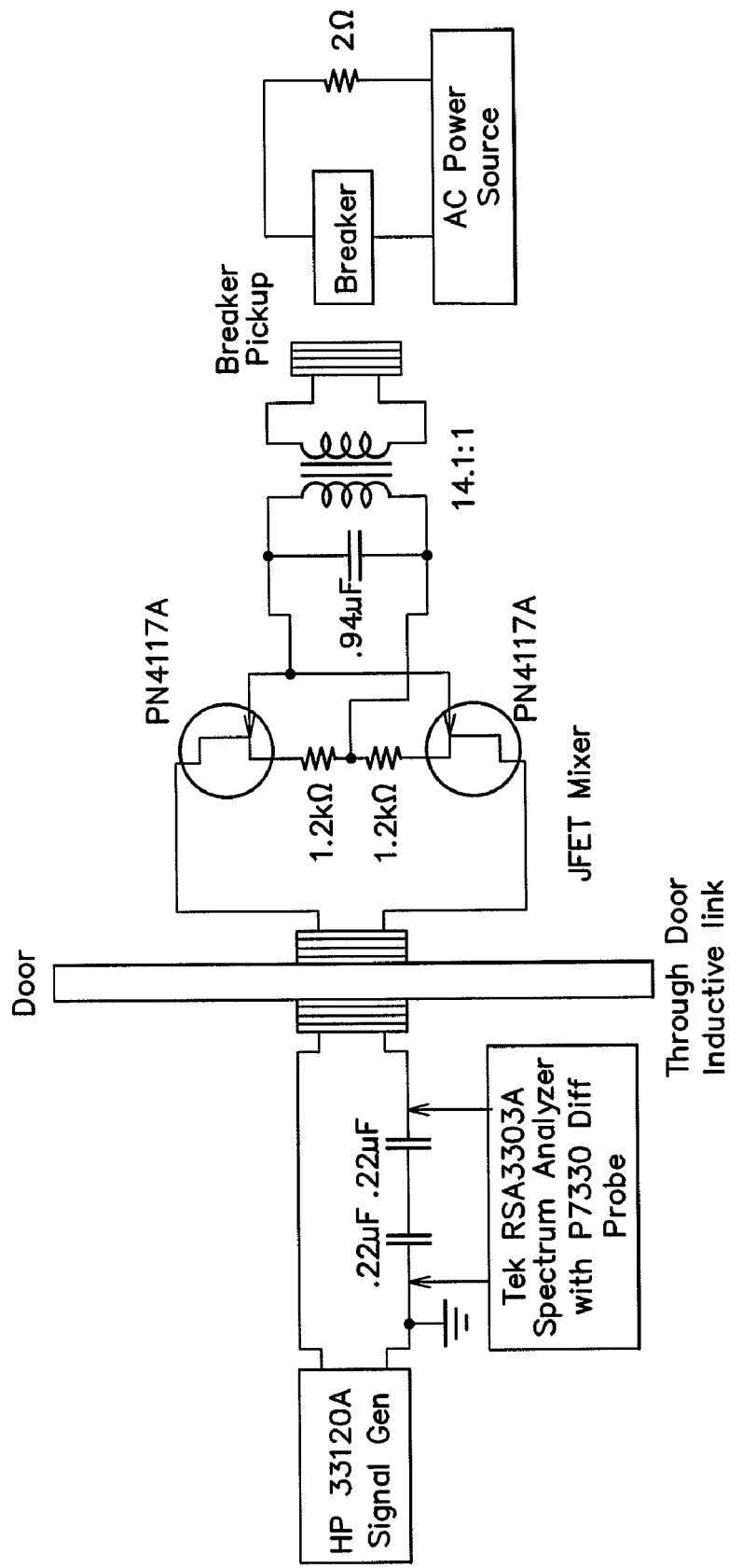
FIG. 12 shows an experimental test setup of the power monitoring system, according to one embodiment.
Figure 13A:
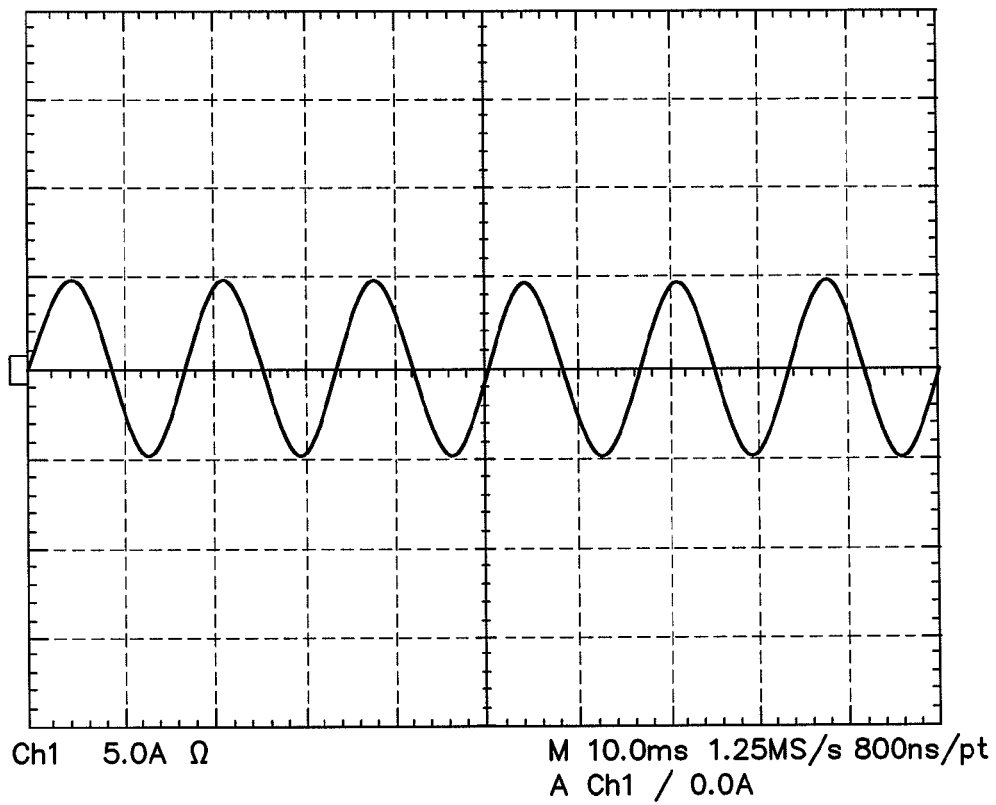
FIGS. 13a-13f show measured waveforms produced by an experimental setup.
Figure 13B:
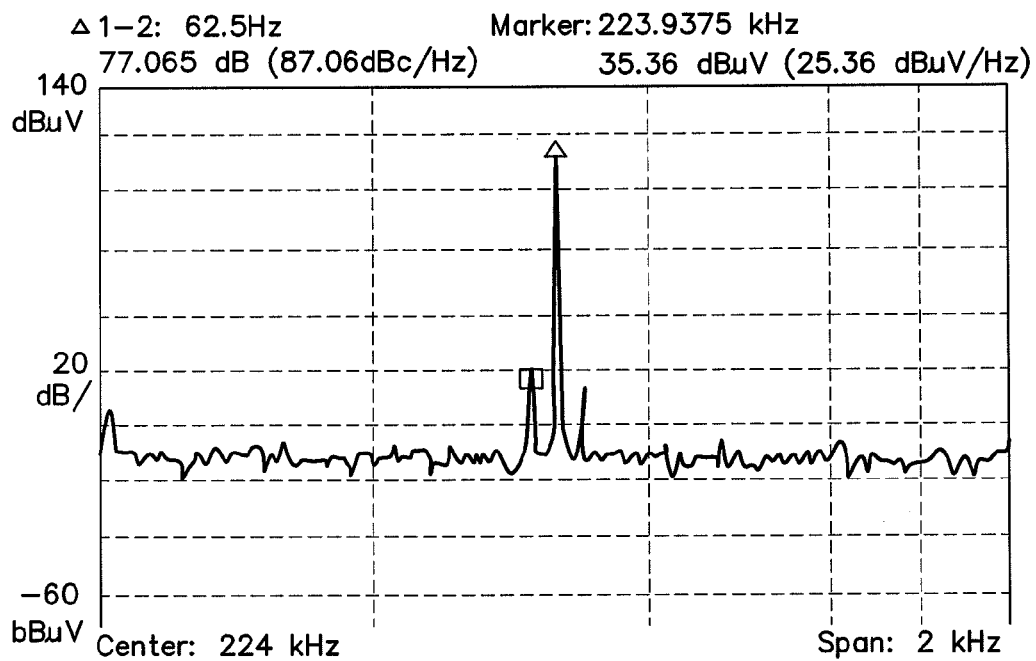
Figure 13C:
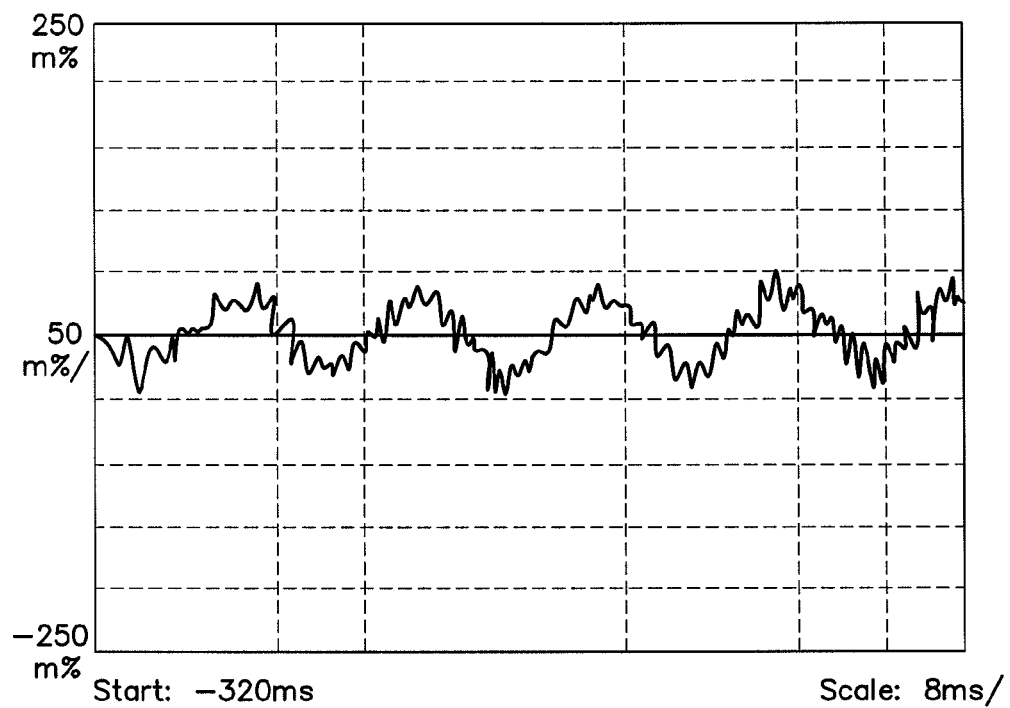
Figure 13D:
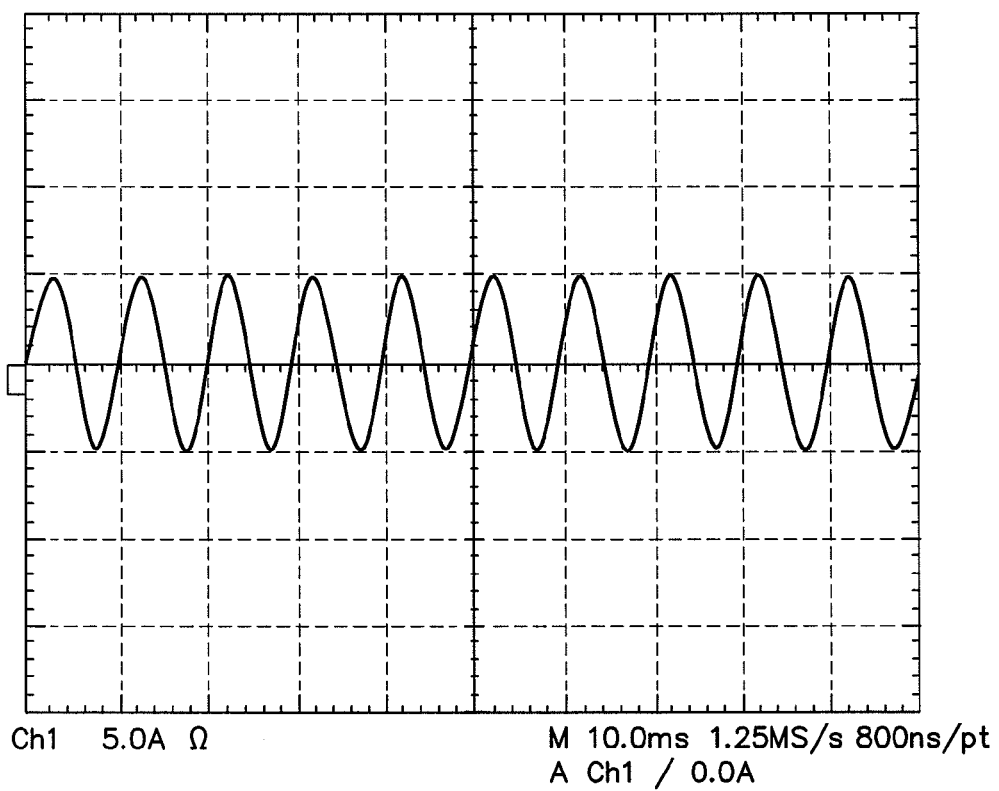
Figure 13E:
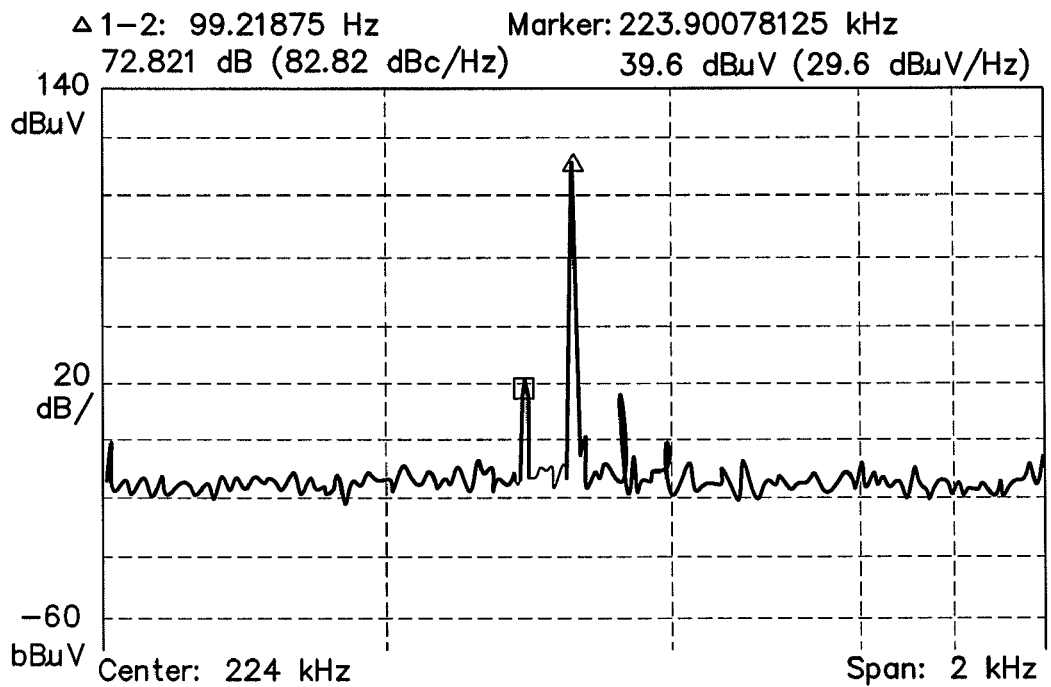
Figure 13F:
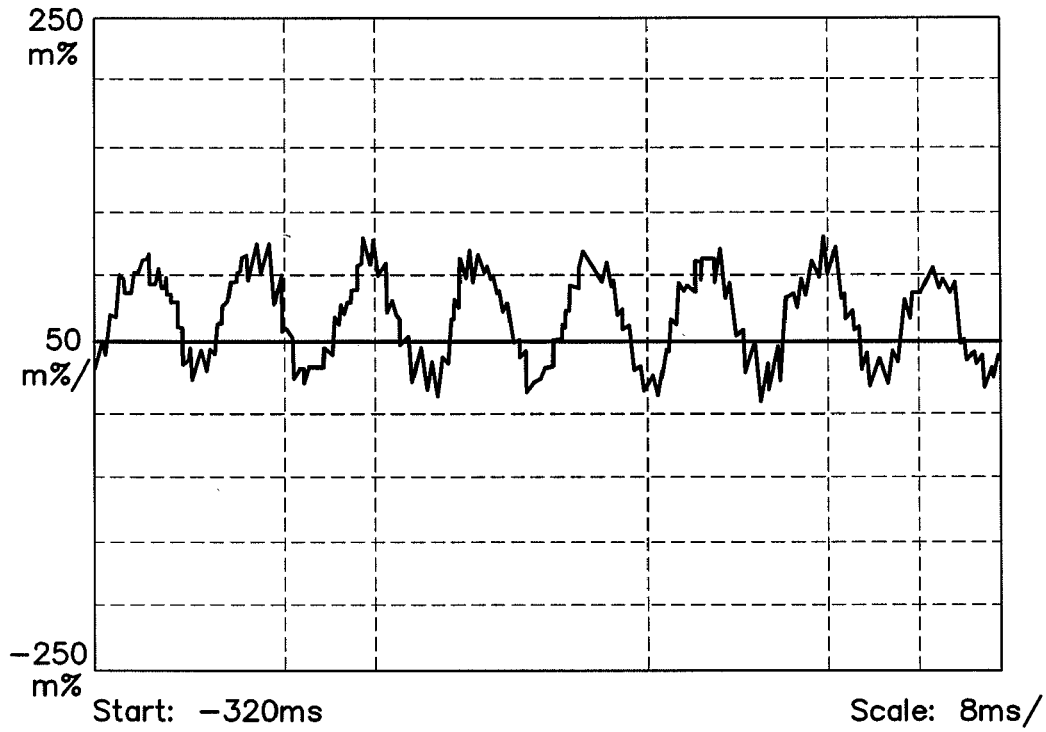

One embodiment of the power monitoring system is shown in FIG. 12. An HP 6834B AC Power Source was set to provide a 60 Hz current signal at 1.5 Amperes and a 100 Hz current signal at 1 Ampere through a 20 load, to simulate the current through the circuit breaker. The magnetic sensor measured this signal at the breaker face. In this experimental setup, a 14.1:1 audio step up transformer was used with a capacitor resonant at 60 Hz to amplify the signal from the magnetic sensor. The signal on the outside of the door was detected and demodulated using a Tektronix RSA3303A spectrum analyzer. The HP 33120A signal generator provided the carrier frequency of 224 kHz at 10 Vpp. The resulting plots are shown in FIG. 13 with the corresponding input current waveforms from the HP 6834B power source. FIG. 13a shows the input waveform for a 60 Hz signal, and FIG. 13b shows the magnitude spectrum plot of the input waveform. FIG. 13d shows the inputs waveform for a 100 Hz signal, and FIG. 13e shows the corresponding magnitude spectrum plot. The lack of higher harmonics in the magnitude spectrum plots show that there is little distortion present, but the fundamental signal is 77 dBμV below the carrier frequency at 60 Hz. This should be sufficient for a synchronous detector to demodulate, and it is well above the noise floor of the spectrum analyzer. FIG. 13c shows the demodulated output for the 60 Hz signal, and FIG. 13f shows the demodulated output for the 100 Hz signal. The demodulated reconstructions clearly correspond to the input signals for both 60 Hz and 100 Hz input current signals. Arbitrary waveforms in the frequencies of interest can similarly be reconstructed.

The inside coil for the inner magnetic coupler was formed of four samarium cobalt magnets of dimension ½ inch by ½ inch by ¼ inch grade 26 MGOe arranged as shown in FIG. 4. Around these magnets was wound 1000 turns of 34 AWG magnet wire with epoxy to hold the structure in place.

A similar coil was made to connect to the other side of the steel door for the outer magnetic coupler. It was arranged so that the N and S poles of each magnet were on top of each other. This particular coil used 24 active windings.

Experiments showed that a resonant secondary may sufficient for adequate functioning of the system and that the primary need not be resonant. The resonant capacitor can be replaced with a small current sense resistor. This reduces signal levels, but it removes the requirement that the two coils be matched. Should the capacitor not be exactly matched, the two nearby resonant points may distort the signal.

Figure 14:
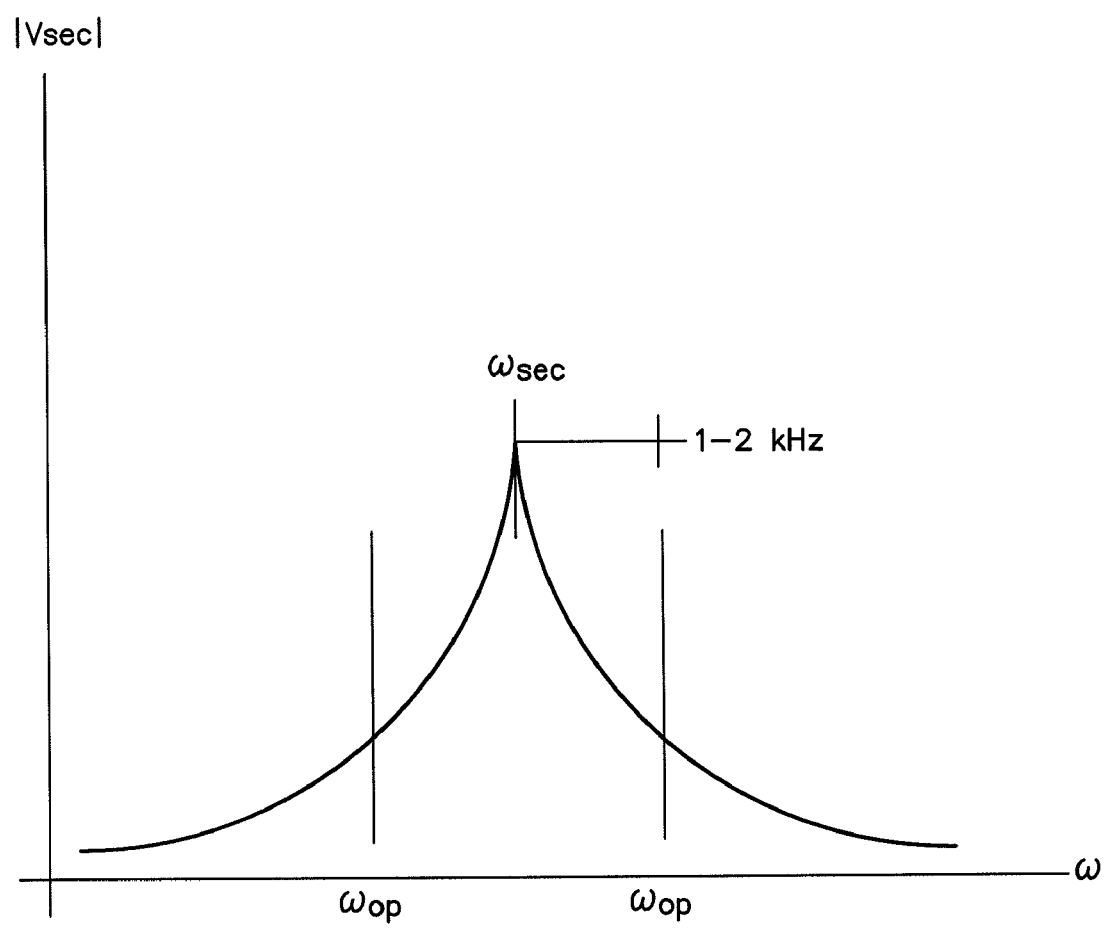
FIG. 14 illustrates the selection of a carrier frequency based on the resonant frequency of the secondary coil of the inner magnetic coupler.

Empirical results from this coil system showed that a suitable operating point for the coils is approximately 1 to 2 kHz displaced from the resonance of the secondary coil on either the upper or lower side of the resonant frequency, as shown in FIG. 14. In FIG. 14, $\omega_{sec}$ is the resonant frequency of the secondary coil, and $\omega_{op}$ are suitable operating frequencies for the carrier. The resonant frequency may be variable because as a function of the door properties and the immediate surroundings. Moving a hand closer than a foot or two to the door panel may affect the received signals considerably. This effect may be due to moving of the resonant point by changing the capacitance of the door with the present coils. When off resonance, the gain is still high, but small changes in the resonant point do not strongly affect the signal. Working on one side of the resonance also may ensures that the rapid phase shift at a resonant point does not perturb the signal.

Magnetic Coupler Coil Design

The optimum carrier frequency for penetrating a given door may be unknown a priori due to variations between doors. To determine a suitable carrier frequency for a door, coils may be wound with many turns on one coil and few turns on the other coil. The resonance of the coil system may be located by sweeping the operating frequency. Connecting the primary coil to a signal generator and sweeping it from approximately 10 kHz to 300 kHz can be performed while monitoring the secondary coil with an oscilloscope. However, adding a ground connection on the secondary coil by using an oscilloscope can change the circuit model of the through-door link significantly because the signal generator driving the outer winding is also ground referenced. This might lead to error in finding the resonance because the actual system has no such direct connection through the door. However, this measurement may be taken to provide an approximate resonant point for the secondary coil. The impedance of the primary coil may be found at the frequency where the secondary coil is approximately resonant. This may enable for the selection of a series impedance to match the primary coil for the purposes of measuring the current for demodulation. This impedance my be resistive or capacitive if resonance is desired. Iteration may be required to maximize signal output in the true system.

Modifications to this procedure might provide an improvement. If the coil can be connected to the sense circuitry, the demodulated output can be monitored while the frequency is swept. This implies that the DSP of the demodulation circuit could perform resonance location at startup. However, the sense impedance may be variable as well to attain good matching between the coils and that sense impedance. The sense impedance and frequency could both need to be swept simultaneously whilst always ensuring an impedance match at the signal frequency. A controller may be used to sweep through various frequencies to find an optimum frequency or a suitable frequency range.

Other Applications

The inventors have appreciated that the inventive techniques disclosed herein may be used for applications beyond power monitoring at the circuit breaker. In some applications, the inventive techniques disclosed herein may be used for monitoring a physical/environmental parameter such as temperature, pressure, humidity, field strength, etc., and sending the sensed information through a region, such as the wall of an enclosure. In certain applications the magnetic field sensor may be replaced with a sensor that measures a different physical/environmental parameter. Inductive coupling may be used to transfer information out of an enclosure. For example, magnetic couplers may be positioned on opposite sides of a pipe to transmit information through the wall of the pipe. Information regarding a physical parameter measured within the pipe, such as pressure, temperature, flow, chemical composition, etc. may be transmitted to the outside of the pipe using the inductive link. Thus, information can be transmitted from a sealed region without breaking the seal (e.g., a hermetic seal). Another example of a sealed enclosure is a waterproof enclosure for housing electronic equipment outdoors (e.g., a NEMA box). These techniques may be used to transmit information through the hull of a submarine or other vessel. A variety of applications are envisioned.

This invention is not limited in its application to the details of construction and the arrangement of components set forth in the foregoing description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A system for monitoring a circuit breaker of a circuit breaker unit, the circuit breaker unit comprising a circuit breaker panel and a door, the circuit breaker being positioned at the circuit breaker panel, the circuit breaker comprising a conductor, wherein a current when flowing in the conductor produces a magnetic field in a proximity of the circuit breaker, the system comprising:
   a first circuit to produce a carrier signal, the first circuit being positioned outside of the circuit breaker unit;

a first magnetic coupler driven by the carrier signal, the first magnetic coupler being positioned outside of the circuit breaker unit on a first side of the door;

a second magnetic coupler positioned inside of the circuit breaker unit on a second side of the door between the door and the circuit breaker panel, the second magnetic coupler being inductively coupled to the first magnetic coupler, the second magnetic coupler being configured to produce a regenerated carrier signal inside of the circuit breaker unit;

a magnetic field sensor positioned in the proximity of the circuit breaker between the door and the circuit breaker panel, the magnetic field sensor being configured to produce a sensed signal in response to the magnetic field produced by the current when flowing in the conductor; and a mixer circuit positioned inside of the circuit breaker unit, the mixer circuit being coupled to the second magnetic coupler and the magnetic field sensor, to modulate the regenerated carrier signal in response to the sensed signal.

2. The system of claim 1, wherein the magnetic field sensor is positioned at a face of the circuit breaker.

3. The system of claim 1, wherein the mixer circuit comprises at least one transistor that modulates the regenerated carrier signal in response to the sensed signal.

4. The system of claim 3, wherein the at least one transistor comprises a first transistor having a first gate controlled by the sensed signal and a second transistor having a second gate controlled by the sensed signal.

5. The system of claim 4, wherein the first and second transistors comprise junction field effect transistors.

6. The system of claim 4, wherein the first transistor modulates the regenerated carrier signal during a positive halfwave of the carrier signal and the second transistor modulates the regenerated carrier signal during a negative halfwave of the carrier signal.

7. The system of claim 4, wherein the mixer circuit comprises at least one resistor to bias the sensed signal such that a biased version of the sensed signal is applied to the first and second gates.

8. The system of claim 1, wherein the first magnetic coupler comprises a first coil and a second magnetic coupler comprises a second coil.

9. The system of claim 8, wherein the first magnetic coupler further comprises a magnet.

10. The system of claim 1, wherein the door comprises a ferromagnetic material.

11. The system of claim 10, wherein the ferromagnetic material comprises steel.

12. The system of claim 11, wherein the first magnetic coupler comprises a magnet to at least partially saturate magnetic domains in the steel.

13. The system of claim 1, wherein the first circuit measures a current through the first magnetic coupler to reproduce the sensed signal.

14. The system of claim 1, wherein the first circuit is configured to demodulate a signal received from the first magnetic coupler.

15. The system of claim 1, wherein the mixer circuit is positioned between the circuit breaker panel and the door.

* * * * *